(12) United States Patent
Kanaya et al.

(10) Patent No.: US 10,593,685 B2
(45) Date of Patent: Mar. 17, 2020

(54) SEMICONDUCTOR DEVICE WITH SUPPRESSION OF ELECTRIC FIELD CONCENTRATION

(71) Applicant: ROHM CO., LTD., Kyoto (JP)

(72) Inventors: Toshiyuki Kanaya, Kyoto (JP); Tsuyoshi Hosono, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/156,739

(22) Filed: Oct. 10, 2018

(65) Prior Publication Data

US 2019/0109148 A1   Apr. 11, 2019

(30) Foreign Application Priority Data

Oct. 11, 2017  (JP) .................................. 2017-198014

(51) Int. Cl.
| | |
|---|---|
| *H01L 27/11524* | (2017.01) |
| *H01L 29/423* | (2006.01) |
| *H01L 29/788* | (2006.01) |
| *H01L 21/28* | (2006.01) |
| *H01L 27/11529* | (2017.01) |
| *H01L 29/08* | (2006.01) |
| *H01L 27/11519* | (2017.01) |
| *H01L 29/66* | (2006.01) |

(52) U.S. Cl.
CPC .. *H01L 27/11524* (2013.01); *H01L 27/11519* (2013.01); *H01L 27/11529* (2013.01); *H01L 29/0847* (2013.01); *H01L 29/40114* (2019.08); *H01L 29/42324* (2013.01); *H01L 29/42328* (2013.01); *H01L 29/42368* (2013.01); *H01L 29/66825* (2013.01); *H01L 29/7881* (2013.01)

(58) Field of Classification Search
CPC ......... H01L 27/11524; H01L 21/28273; H01L 29/7881; H01L 29/66825; H01L 29/42324; H01L 27/11519; H01L 29/42328; H01L 27/11529; H01L 29/0847
See application file for complete search history.

(56) References Cited

U.S. PATENT DOCUMENTS

| | | | |
|---|---|---|---|
| 6,255,691 B1 * | 7/2001 | Hashimoto | ....... H01L 21/28273 257/315 |
| 9,171,962 B2 * | 10/2015 | Hosono | ................. H01L 29/788 |
| 2002/0105020 A1 | 8/2002 | Park | |
| 2010/0133603 A1 * | 6/2010 | Sekiguchi | .......... G11C 16/0408 257/319 |

* cited by examiner

*Primary Examiner* — Sonya D. McCall-Shepard
(74) *Attorney, Agent, or Firm* — Rabin & Berdo, P.C.

(57) ABSTRACT

A semiconductor device includes a semiconductor layer having a main surface, a gate insulating film including a thin film portion forming a tunnel window, a thick film portion formed around the thin film portion and having a thickness larger than a thickness of the thin film portion, and an inclined portion connecting the thin film portion and the thick film portion and inclined upward from the thin film portion toward the thick film portion, and covering the main surface of the semiconductor layer, a memory gate structure formed on the thin film portion of the gate insulating film, and a select gate structure formed on the thick film portion of the gate insulating film.

11 Claims, 49 Drawing Sheets

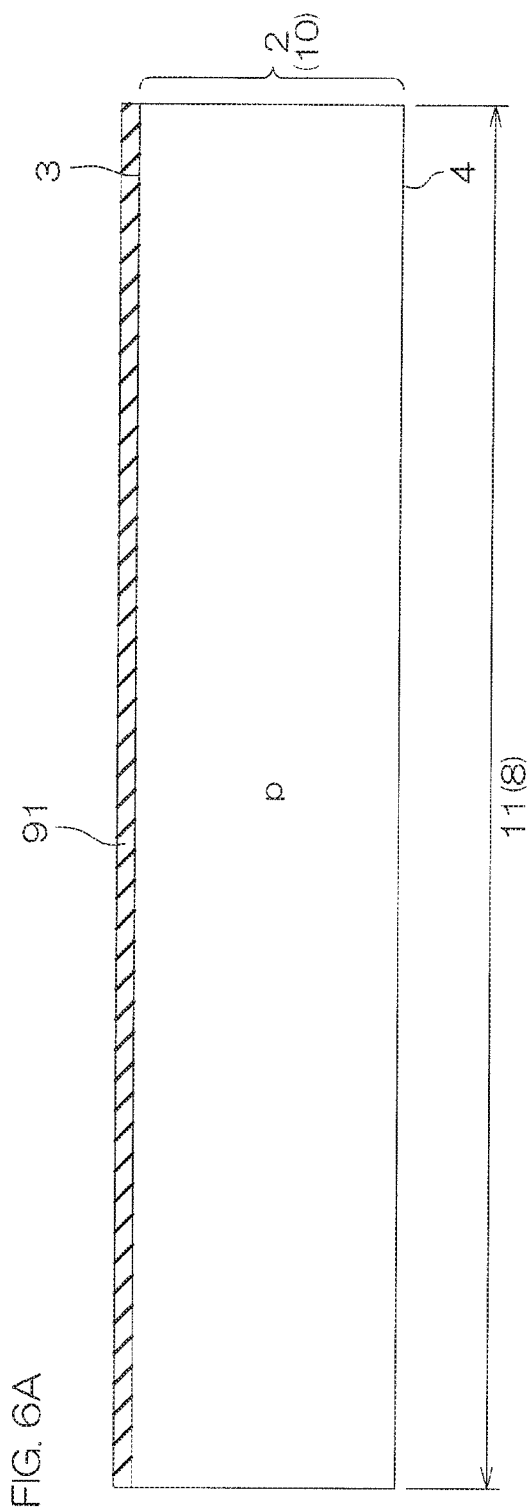

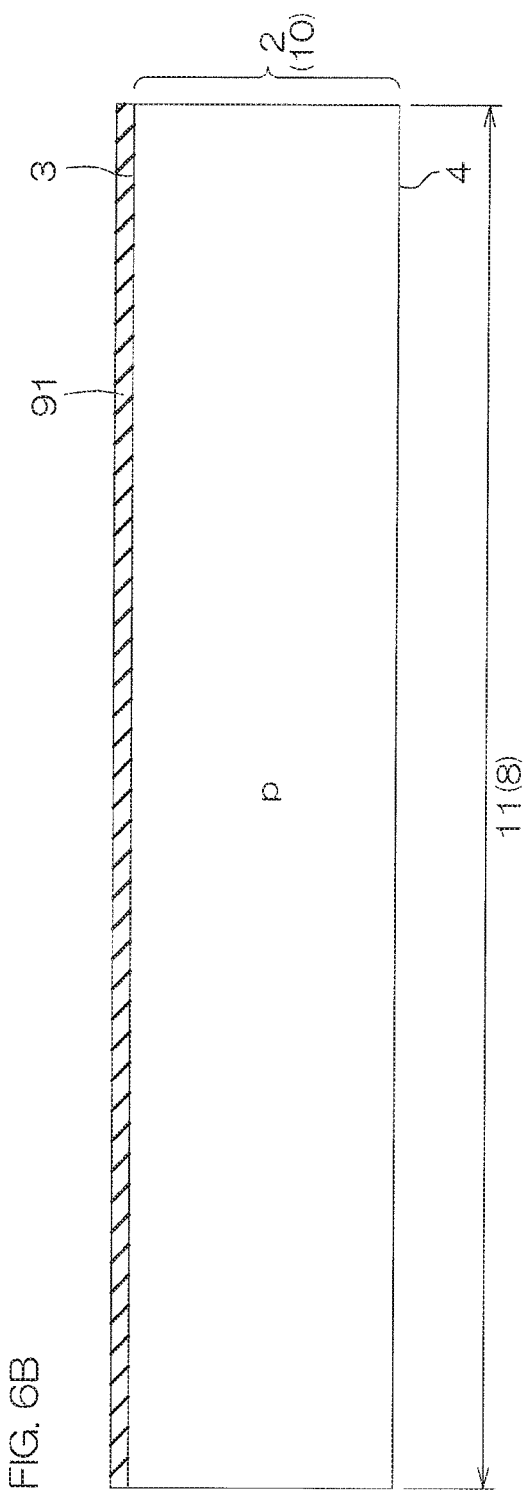

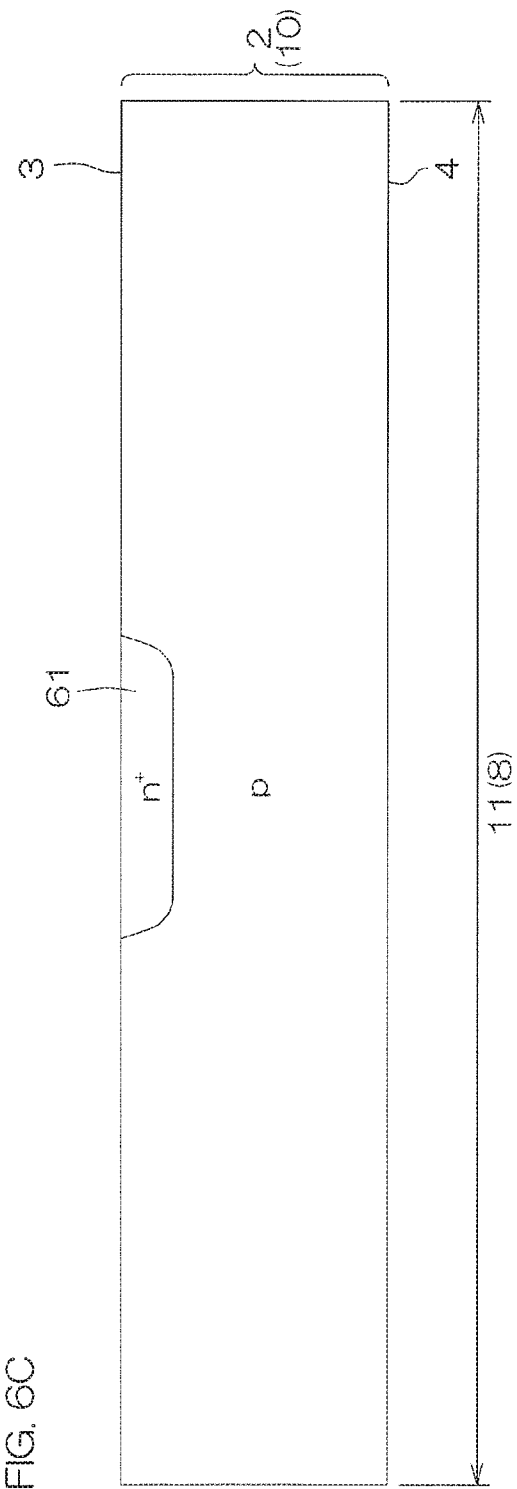

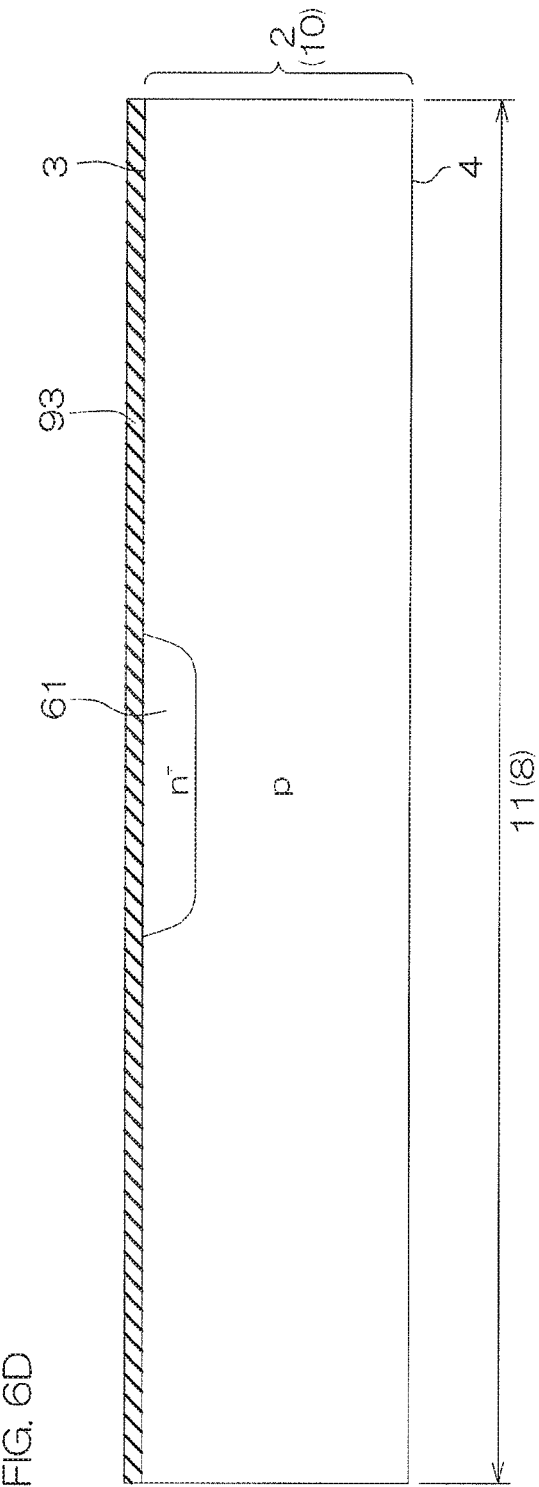

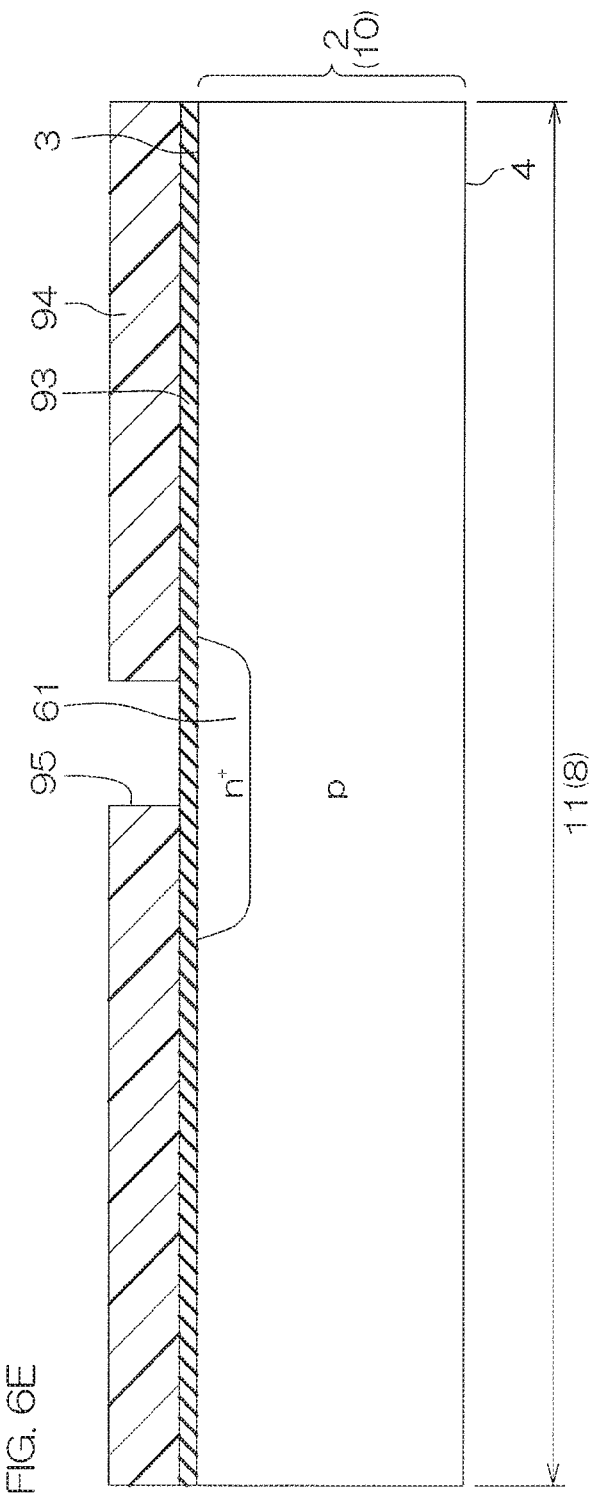

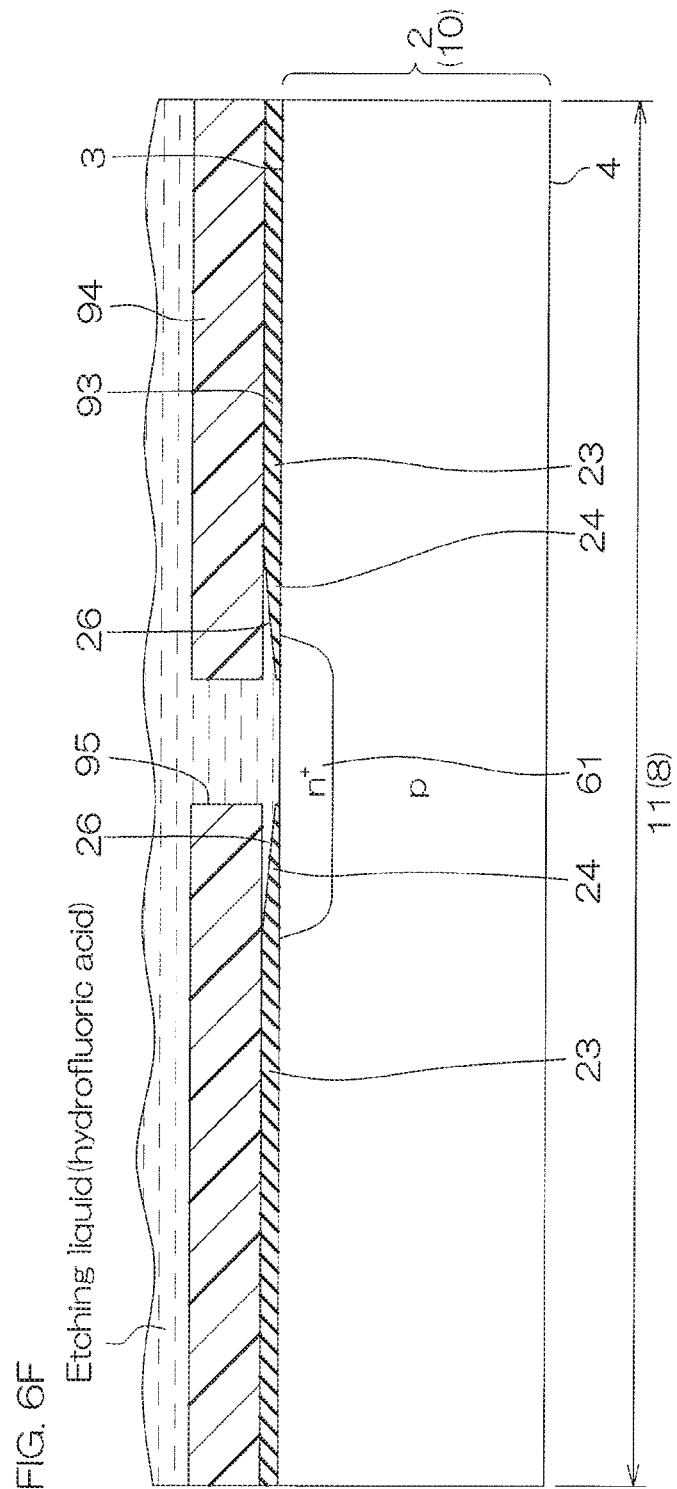

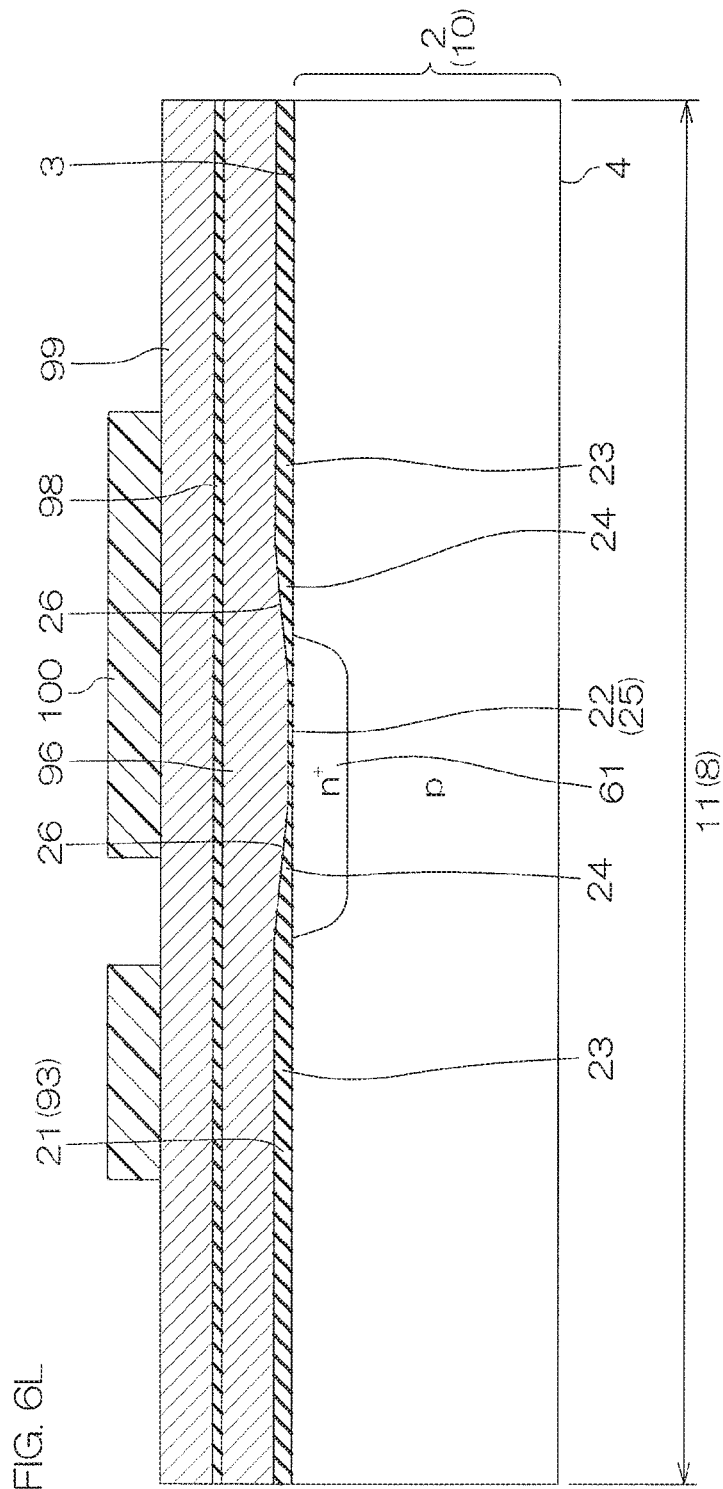

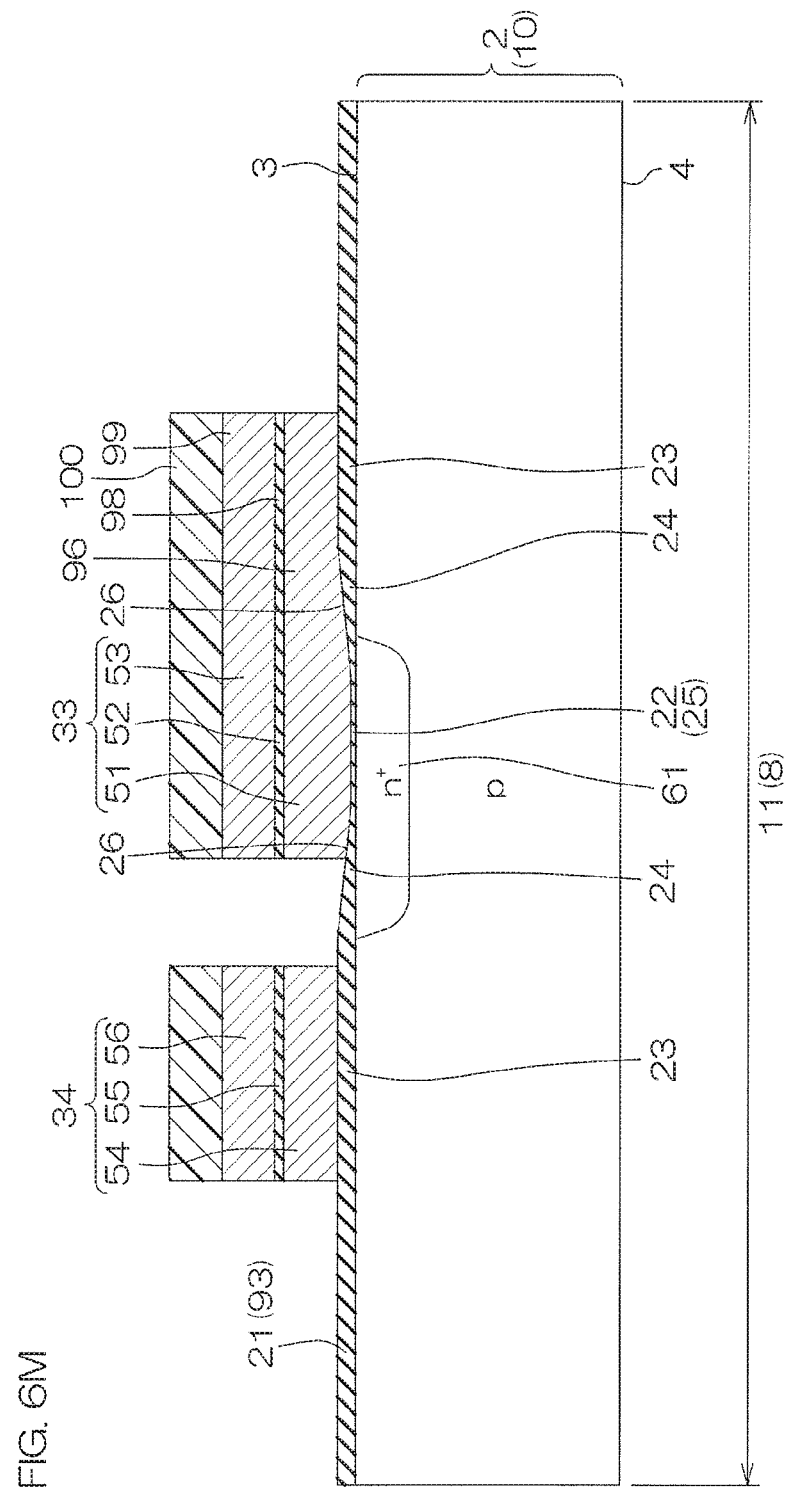

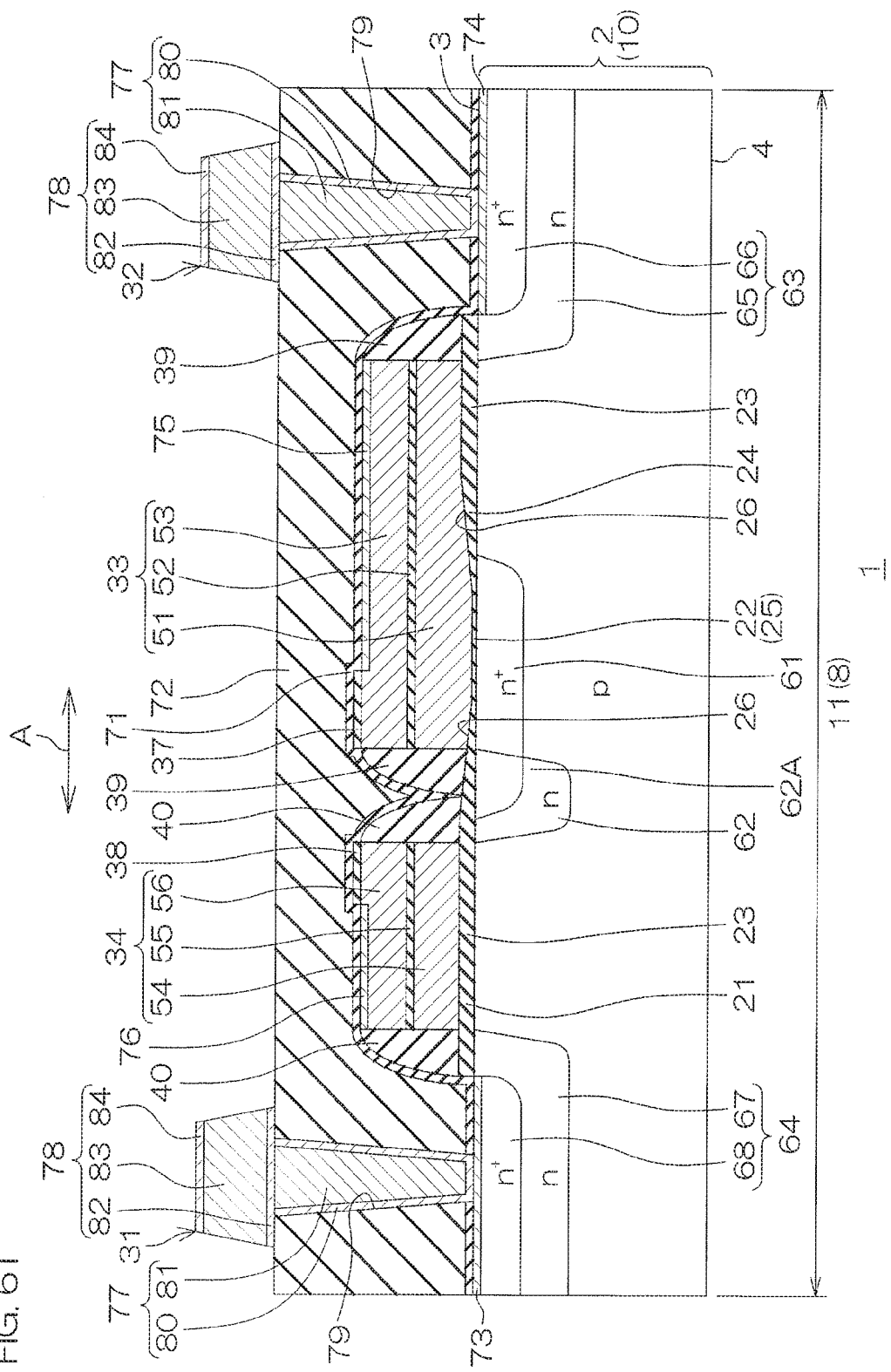

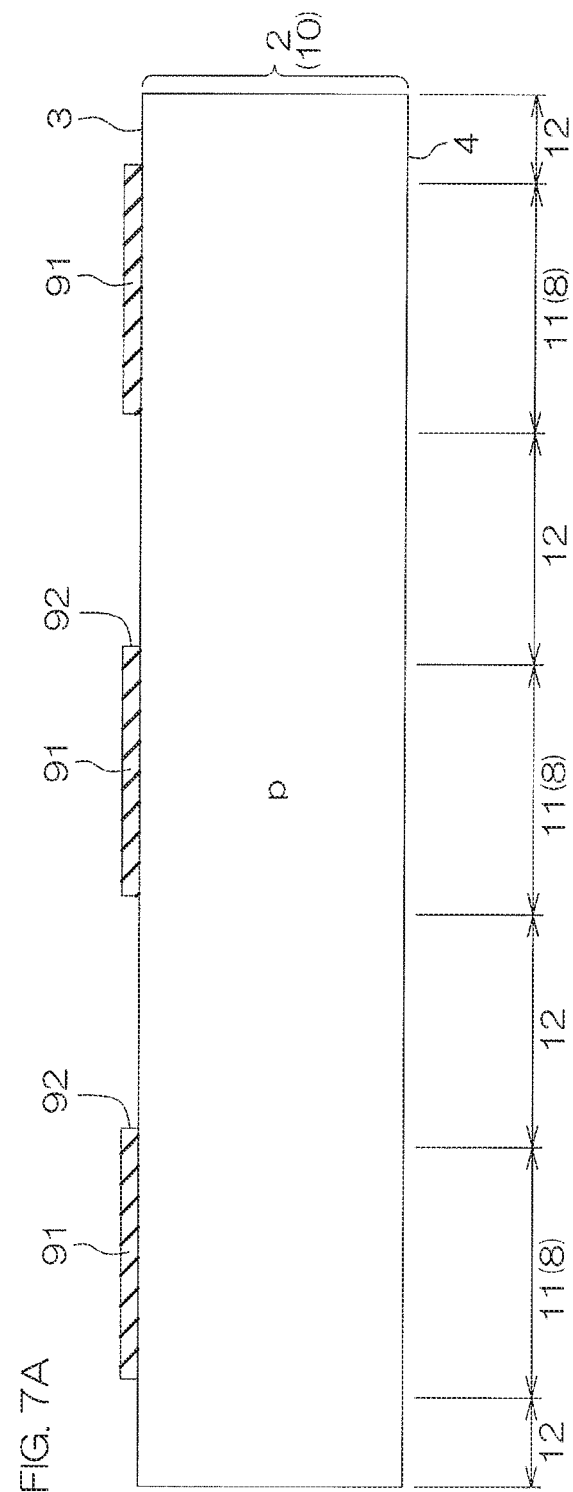

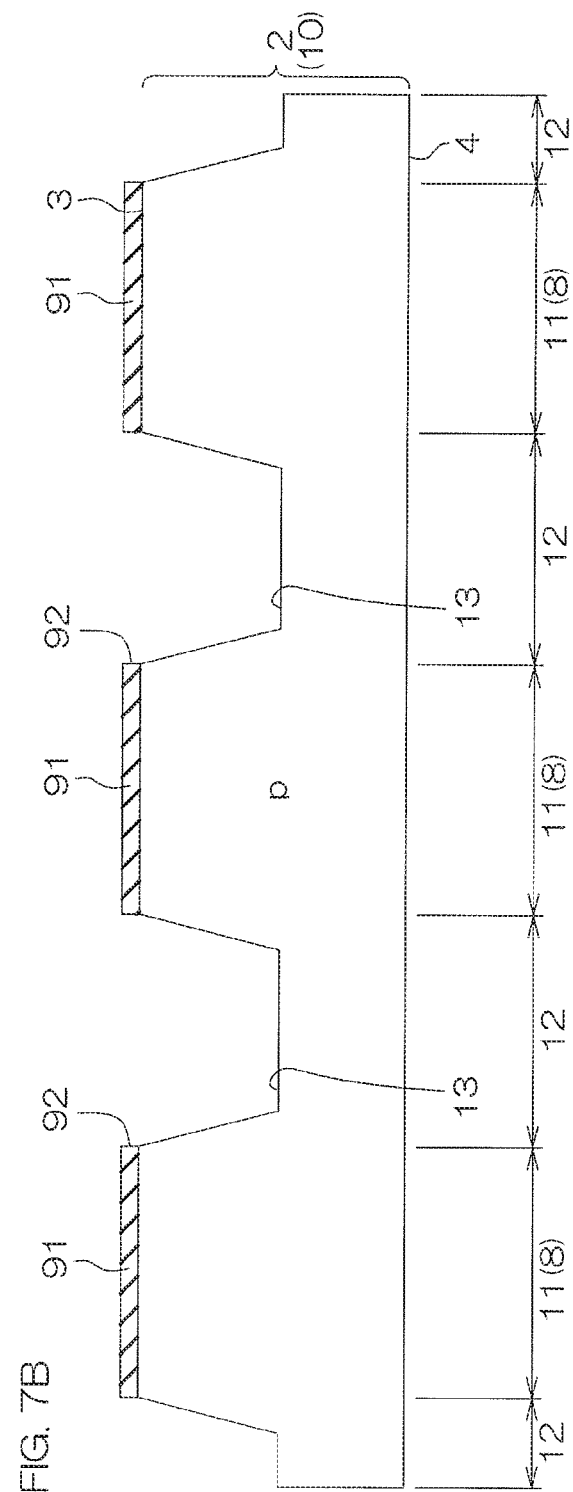

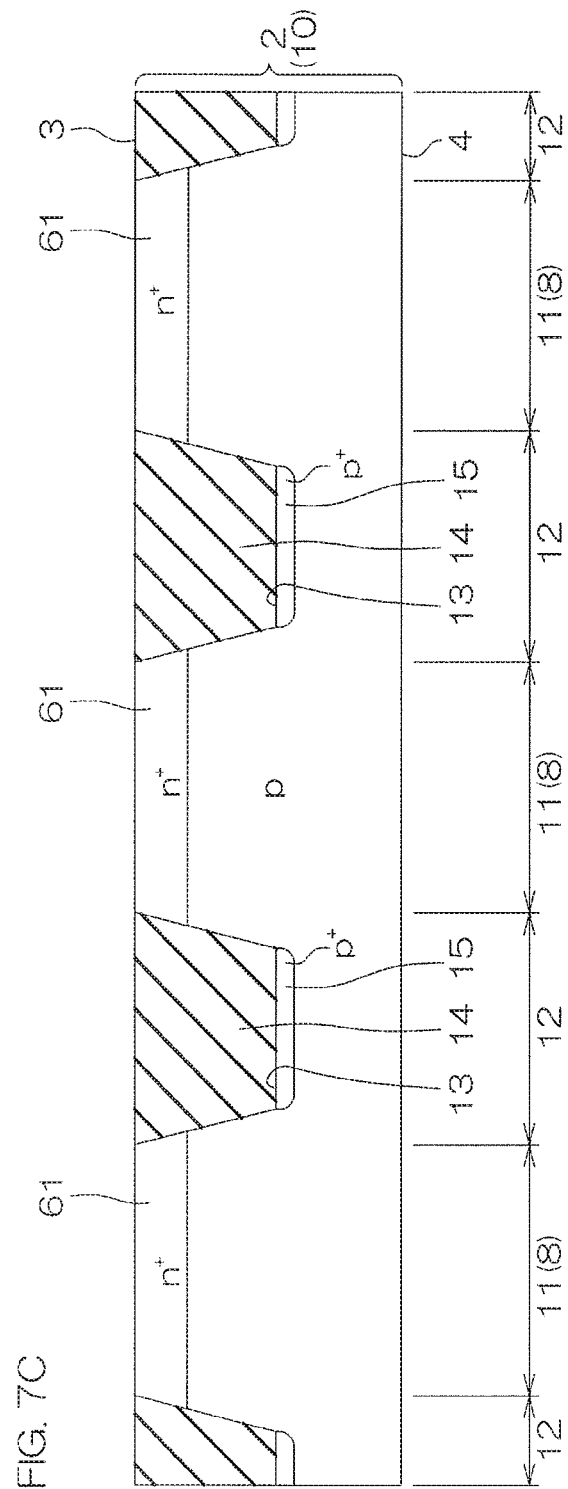

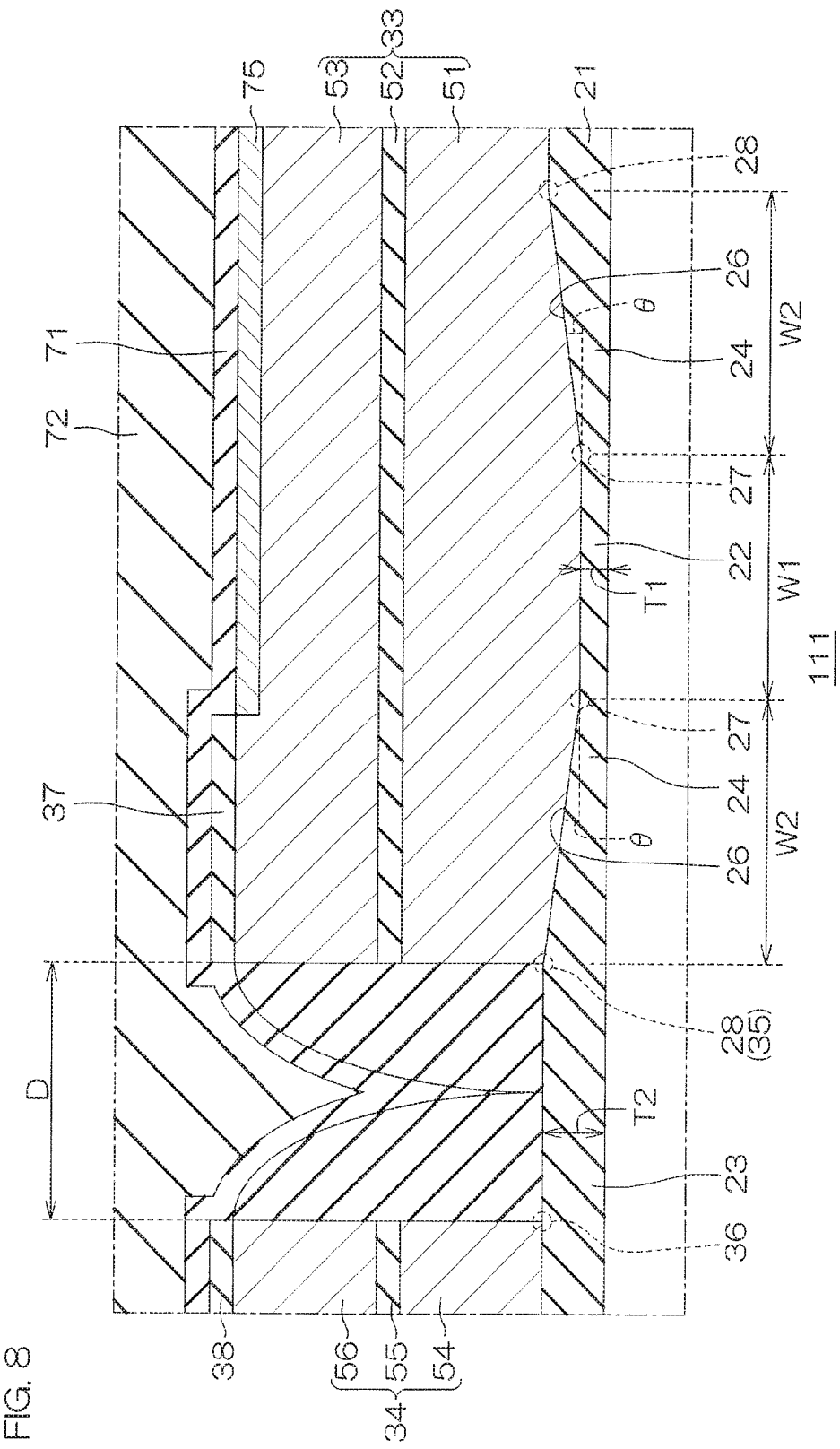

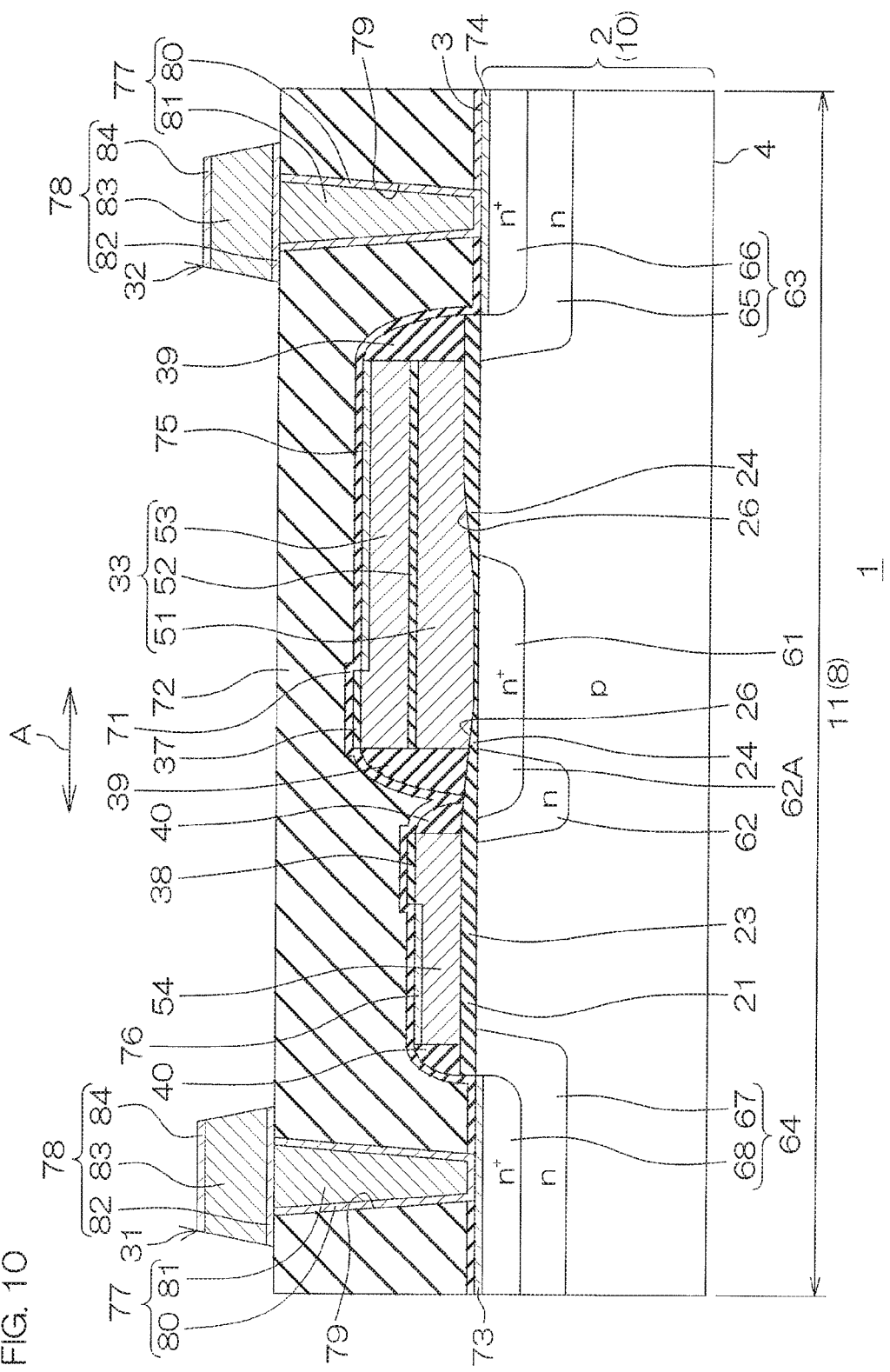

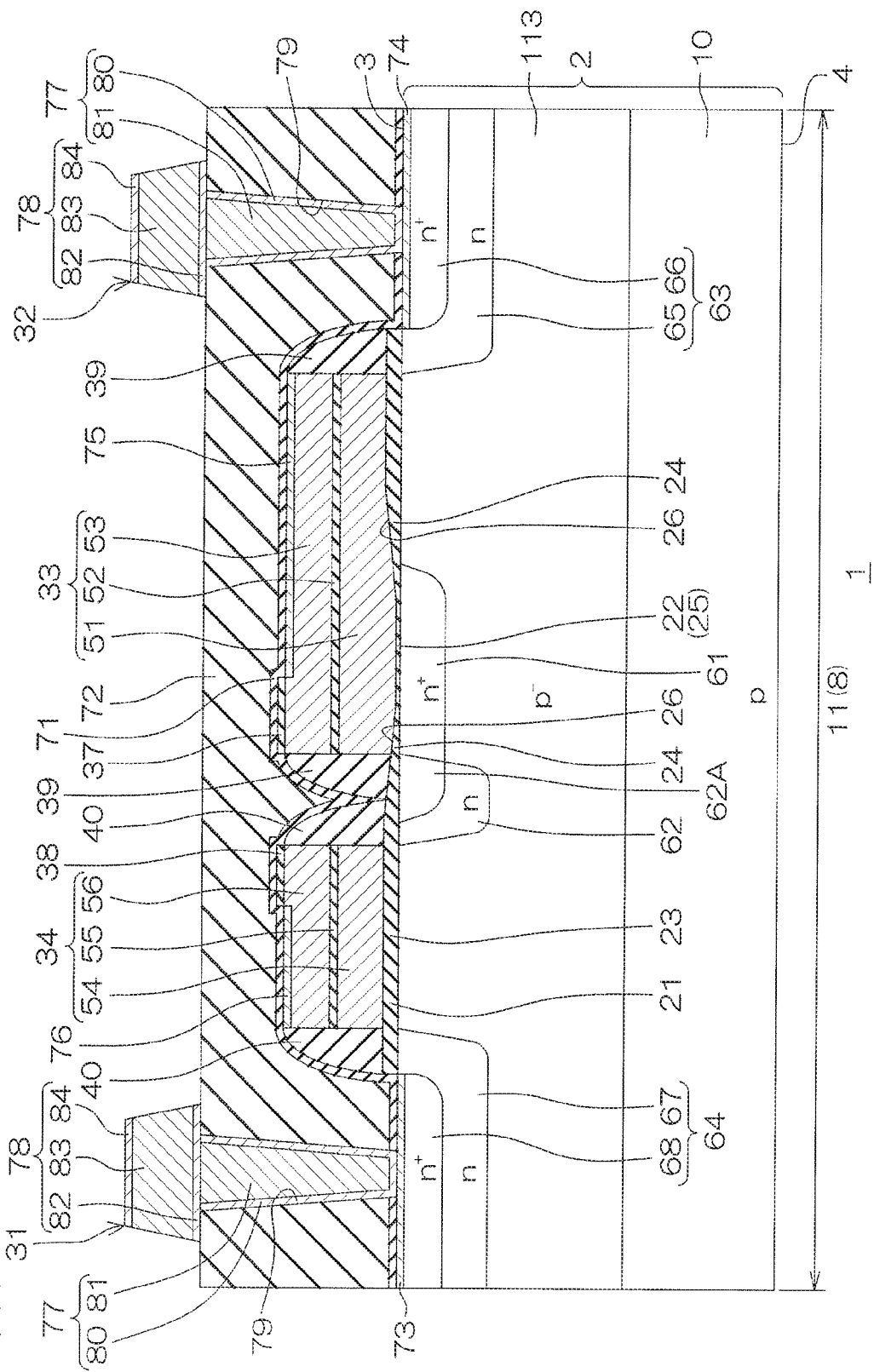

SEMICONDUCTOR DEVICE WITH SUPPRESSION OF ELECTRIC FIELD CONCENTRATION

CROSS REFERENCE TO RELATED APPLICATIONS

This application claims the benefit of priority to Japanese Patent Application No. 2017-198014 filed on Oct. 11, 2017. The entire contents of the application are hereby incorporated herein by reference.

BACKGROUND OF THE INVENTION

1. Field of the Invention

The present invention relates to a semiconductor device.

2. Description of the Related Art

US 2002105020 A1 discloses a nonvolatile memory device as an example of a semiconductor device. The nonvolatile memory device includes a semiconductor substrate. A gate insulating film is formed on the semiconductor substrate. The gate insulating film includes a tunnel insulating film forming a tunnel window. A memory gate structure is formed on the tunnel insulating film in the gate insulating film. A select gate structure is formed on a region other than the tunnel insulating film in the gate insulating film.

SUMMARY OF THE INVENTION

A preferred embodiment of the present invention provides a semiconductor device including a semiconductor layer having a main surface, a gate insulating film including a thin film portion forming a tunnel window, a thick film portion formed around the thin film portion and having a thickness larger than a thickness of the thin film portion, and an inclined portion connecting the thin film portion and the thick film portion and inclined upward from the thin film portion toward the thick film portion, and covering the main surface of the semiconductor layer, a memory gate structure formed on the thin film portion of the gate insulating film, and a select gate structure formed on the thick film portion of the gate insulating film.

The aforementioned or other objects, features, and effects of the present invention will be clarified by the following description of preferred embodiments given below with reference to the accompanying drawings.

BRIEF DESCRIPTION OF THE DRAWINGS

FIG. 8 is an enlarged view of a portion corresponding to FIG. 5, which is an enlarged view to describe a structure of a semiconductor device according to a second preferred embodiment of the present invention.

FIG. 10 is a sectional view of a portion corresponding to FIG. 3, showing a modification of a select gate structure.

FIG. 11 is a sectional view of a portion corresponding to FIG. 3, showing a modification of a semiconductor layer.

DETAILED DESCRIPTION OF THE PREFERRED EMBODIMENTS

In a conventional semiconductor device, a gate insulating film and a tunnel insulating film are connected by a wall portion extending perpendicularly to a main surface of a semiconductor substrate. Therefore, an electric field concentrates at an angle portion connecting the gate insulating film and the wall portion and an angle portion connecting the tunnel insulating film and the wall portion. As a result, deterioration of various electrical characteristics, such as deterioration of dielectric breakdown strength and a decrease in charge amount passing through the tunnel insulating film, may occur.

A preferred embodiment of the present invention provides a semiconductor device capable of suppressing electric field concentration at the gate insulating film.

A preferred embodiment of the present invention provides a semiconductor device including a semiconductor layer having a main surface, a gate insulating film including a thin film portion forming a tunnel window, a thick film portion formed around the thin film portion and having a thickness larger than a thickness of the thin film portion, and an inclined portion connecting the thin film portion and the thick film portion and inclined upward from the thin film portion toward the thick film portion, and covering the main surface of the semiconductor layer, a memory gate structure formed on the thin film portion of the gate insulating film, and a select gate structure formed on the thick film portion of the gate insulating film.

According to this semiconductor device, the thin film portion and the thick film portion are connected by the inclined portion in the gate insulating film. Accordingly, it is possible to suppress formation of an angle portion at the connecting portion between the thin film portion and the thick film portion, so that electric field concentration at the gate insulating film can be relaxed. Therefore, it is possible to suppress deterioration of electrical characteristics, such as deterioration of dielectric breakdown strength and a decrease in charge amount passing through the thin film portion.

Hereinafter, preferred embodiments of the present invention are described with reference to the accompanying drawings.

Figure 1:
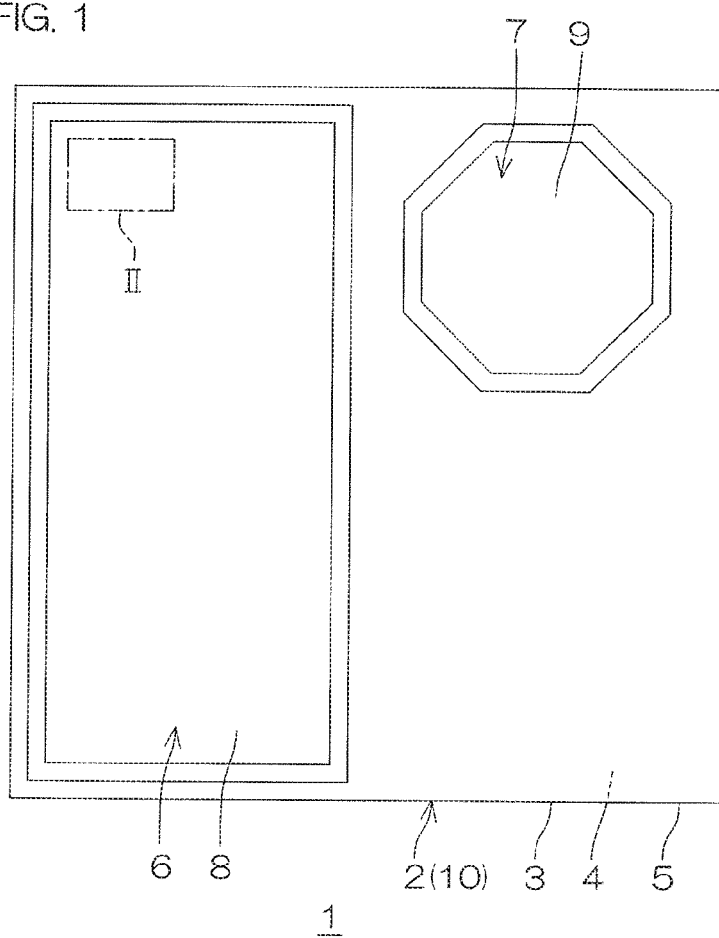
FIG. 1 is a plan view showing a semiconductor device according to a first preferred embodiment of the present invention.

FIG. 1 is a plan view of a semiconductor device 1 according to a first preferred embodiment of the present invention.

Referring to FIG. 1, the semiconductor device 1 includes a semiconductor layer 2 having a rectangular parallelepiped shape. The semiconductor layer 2 has a first main surface 3 on one side, a second main surface 4 on the other side, and a side surface 5 connecting the first main surface 3 and the second main surface 4. The first main surface 3 and the second main surface 4 of the semiconductor layer 2 are formed in quadrilateral shapes in a planar view viewed from their normal directions (hereinafter, simply referred to as "in the planar view").

A memory region 6 is formed at the first main surface 3 of the semiconductor layer 2. An EEPROM (Electrically Erasable Programmable Read Only Memory) 8 as an example of a nonvolatile memory is formed at the memory region 6.

A diode region 7 is further formed across an interval from the memory region 6 at the first main surface 3 of the semiconductor layer 2. A Zener diode 9 is formed in the diode region 7, in the present preferred embodiment. The Zener diode 9 limits and stabilizes, for example, a voltage to be supplied to the EEPROM 8.

Figure 2:
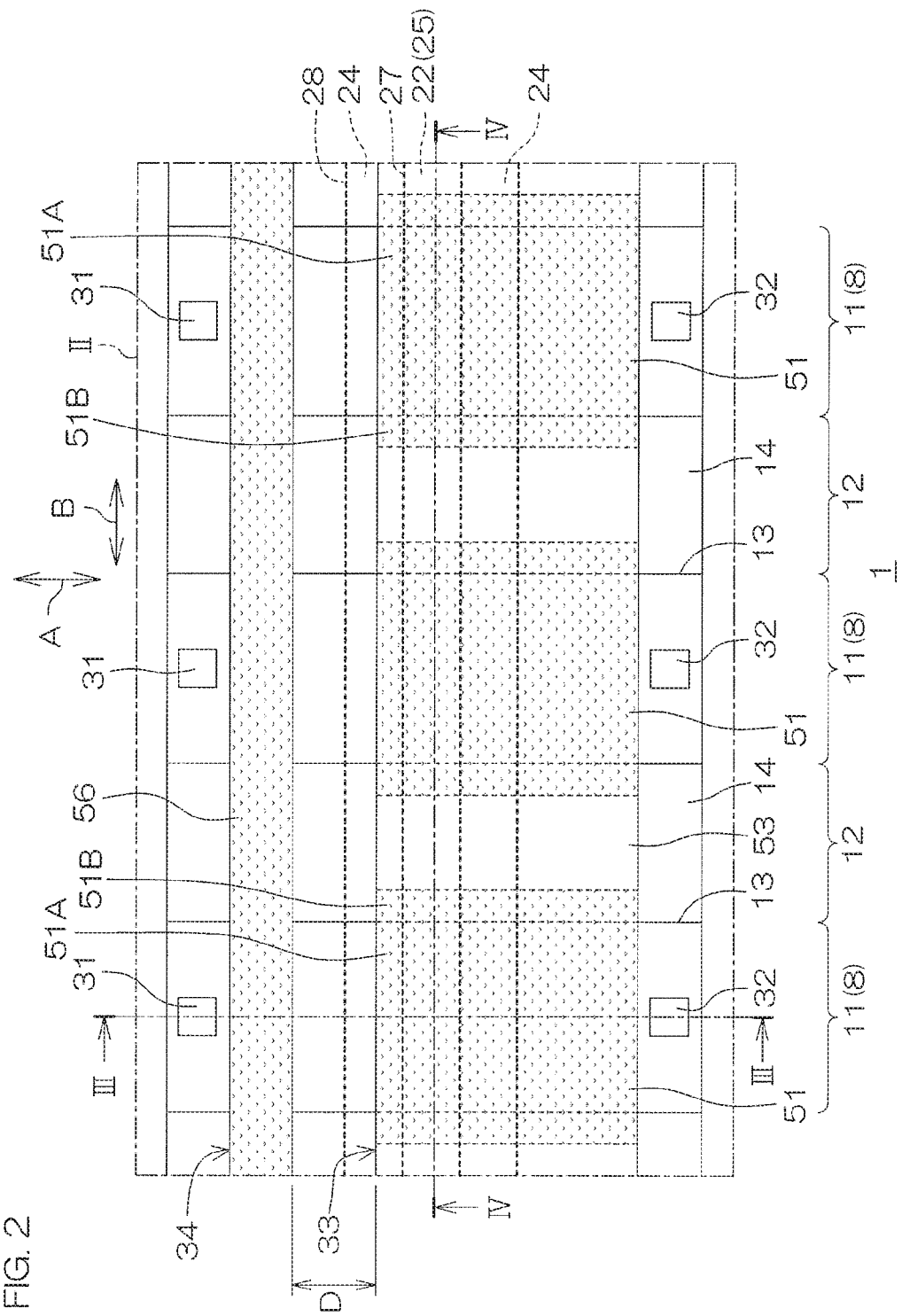
FIG. 2 is an enlarged view of a region II in FIG. 1.
Figure 3:
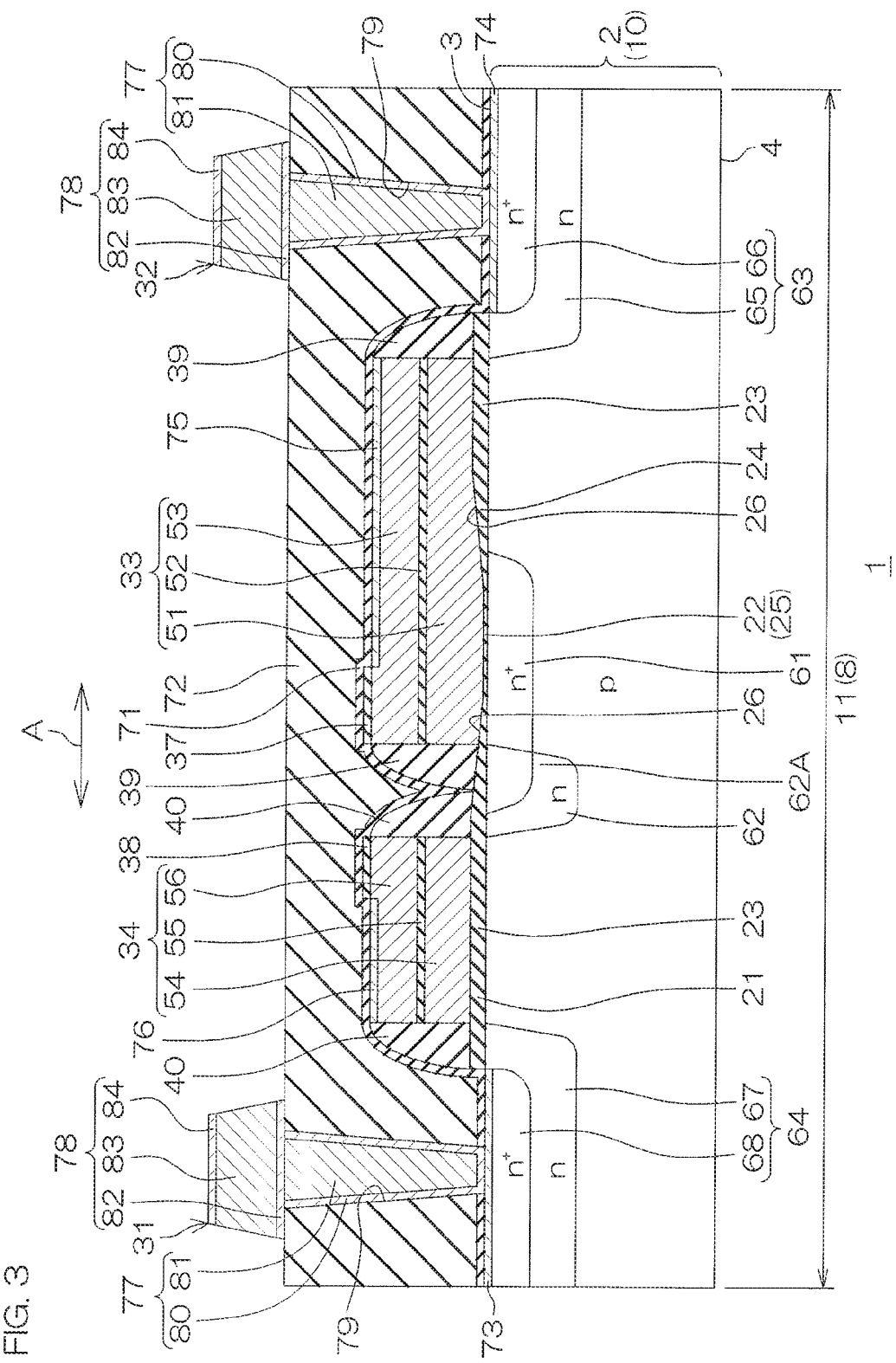
FIG. 3 is a sectional view taken along line in FIG. 2.
Figure 4:
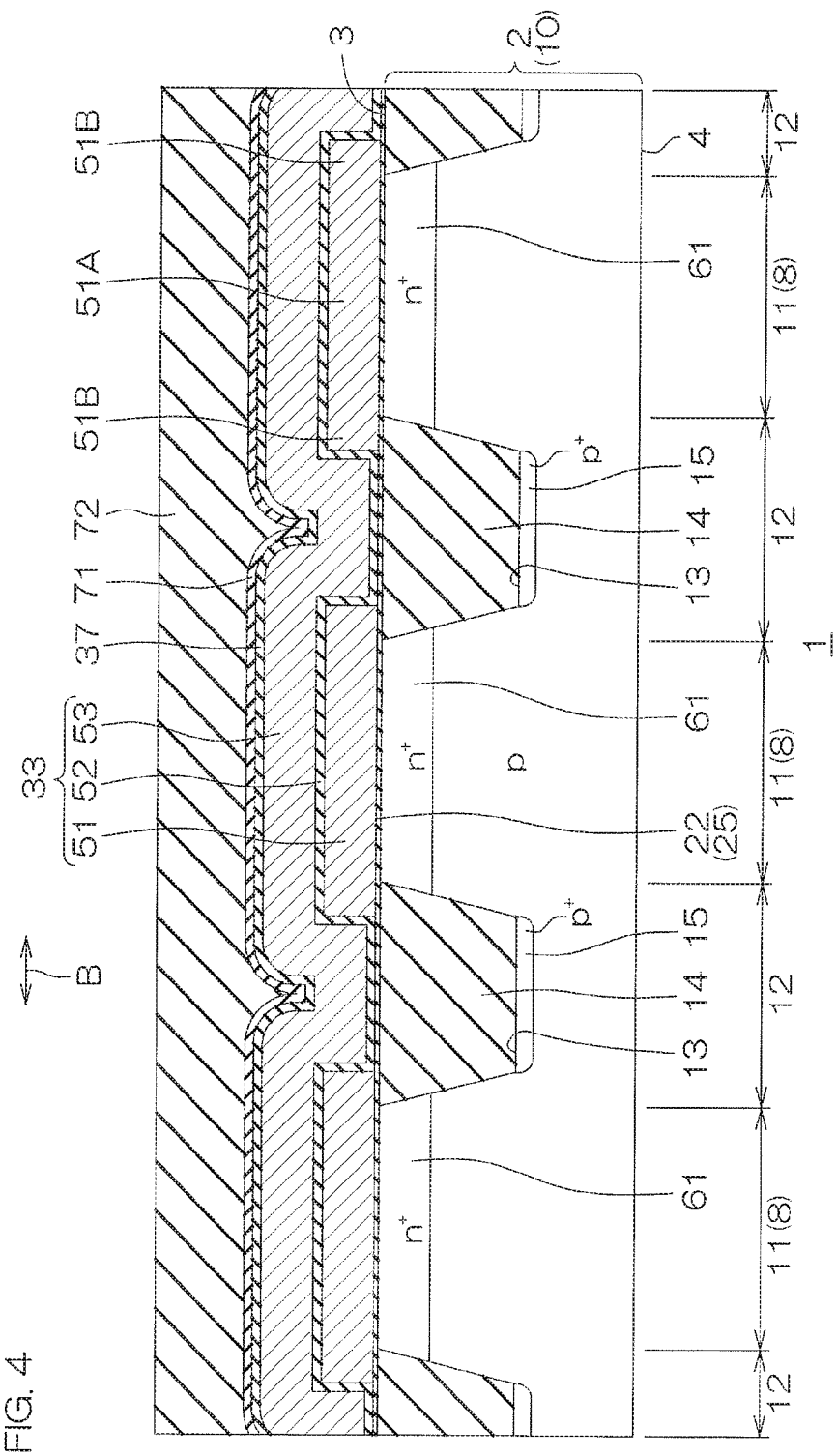
FIG. 4 is a sectional view taken along line IV-IV in FIG. 3.
Figure 5:
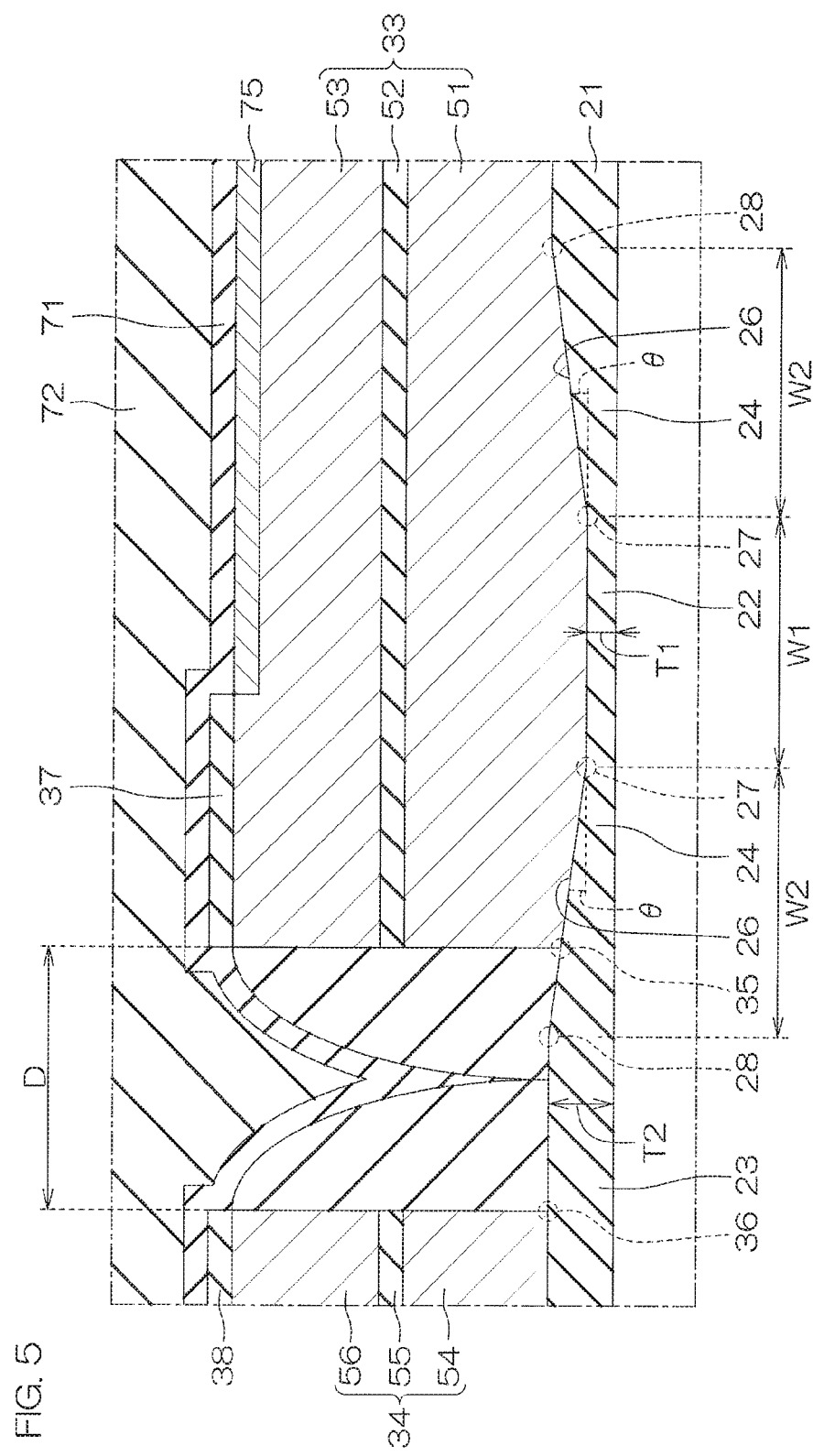
FIG. 5 is an enlarged view to describe a detailed structure of a gate insulating film.

FIG. 2 is an enlarged view of a region II in FIG. 1. FIG. 3 is a sectional view taken along line in FIG. 2. FIG. 4 is a sectional view taken along line IV-IV in FIG. 3. FIG. 5 is an enlarged view to describe a detailed structure of a gate insulating film 21.

Referring to FIG. 2 to FIG. 5, the semiconductor layer 2 includes a semiconductor substrate 10 of a p-type, in the present preferred embodiment. A p-type impurity concentration of the semiconductor substrate 10 may be not less than $1.0 \times 10^{14}$ cm$^{-3}$ and not more than $1.0 \times 10^{15}$ cm$^{-3}$. The semiconductor layer 2 may have a single-layer structure consisting of the semiconductor substrate 10. The semiconductor substrate 10 may be a silicon substrate or a SiC (silicon carbide) substrate.

A plurality of active regions 11 are set in the semiconductor layer 2 in the memory region 6. The EEPROM 8 is formed in each of the active regions 11. The plurality of active regions 11 are respectively set in band shapes extending along the same direction, in the present preferred embodiment. The plurality of active regions 11 are set so that the active regions 11 have a stripe shape as a whole.

Hereinafter, a direction in which the active regions 11 extend is referred to as a first direction A, and a direction crossing the first direction A is referred to as a second direction B. More specifically, the second direction B is set orthogonal to the first direction A.

The plurality of active regions 11 are respectively partitioned by region separating structures 12 formed in the first main surface 3. The region separating structures 12 extend in band shapes along the respective active regions 11 in a planar view. The region separating structures 12 may be formed in annular shapes surrounding the respective active regions 11 in a planar view.

The region separating structure 12 has a trench insulating structure, in the present preferred embodiment. The trench insulating structure includes a trench 13 and an insulator layer 14. The trench 13 is formed at the first main surface 3. The trench 13 may be formed in a tapered shape having a bottom area smaller than an opening area. A depth of the trench 13 may be not less than 0.5 μm and not more than 1.0 μm.

The depth of the trench 13 may be not less than 0.5 μm and not more than 0.6 μm, not less than 0.6 μm and not more than 0.7 μm, not less than 0.7 μm and not more than 0.8 μm, not less than 0.8 μm and not more than 0.9 μm, or not less than 0.9 μm and not more than 1.0 μm.

The insulator layer 14 is embedded in the trench 13. The insulator layer 14 may include silicon oxide. The trench insulating structure is also referred to as a DTI (Deep Trench Isolation) structure or an STI (Shallow Trench Isolation) structure according to the depth or an aspect ratio of the trench 13.

The region separating structure 12 may include a LOCOS (Local Oxidation of Silicon) layer formed by oxidizing the first main surface 3 by a thermal oxidation method, in place of or in addition to the trench insulating structure.

The region separating structure 12 may include a field stop region 15 of the p-type. The field stop region 15 is formed in a region along a bottom wall of the trench 13 in the semiconductor layer 2.

A gate insulating film 21 is formed on the first main surface 3 of the semiconductor layer 2. The gate insulating film 21 collectively covers the plurality of active regions 11. The gate insulating film 21 includes a thin film portion 22, a thick film portion 23, and an inclined portion 24.

The thin film portion 22 of the gate insulating film 21 forms a tunnel window 25. The thin film portion 22 makes electric charges (electrons) pass through by Fowler-Nordheim Tunneling. The thin film portion 22 is formed in the plurality of active regions 11, respectively. In the present preferred embodiment, the thin film portion 22 extends in a band shape along the second direction B so as to get across the region separating structures 12, and extends across the plurality of active regions 11.

A width W1 of the thin film portion 22 may be not less than 200 nm and not more than 600 nm. The width W1 is a width of the thin film portion 22 along the first direction A. The width W1 may be not less than 200 nm and not more than 250 nm, not less than 250 nm and not more than 300 nm, not less than 300 nm and not more than 350 nm, not less than 350 nm and not more than 400 nm, not less than 400 nm and not more than 450 nm, not less than 450 nm and not more than 500 nm, not less than 500 nm and not more than 550 nm, or not less than 550 nm and not more than 600 nm. The width W1 is, in the present preferred embodiment, approximately 450 nm.

A thickness T1 of the thin film portion 22 may be not less than 5 nm and not more than 15 nm. The thickness T1 may be not less than 5 nm and not more than 6 nm, not less than 6 nm and not more than 7 nm, not less than 7 nm and not more than 8 nm, not less than 8 nm and not more than 9 nm, not less than 9 nm and not more than 10 nm, not less than 10 nm and not more than 11 nm, not less than 11 nm and not more than 12 nm, not less than 12 nm and not more than 13 nm, not less than 13 nm and not more than 14 nm, or not less than 14 nm and not more than 15 nm. The thickness T1 is, in the present preferred embodiment, approximately 8 nm.

The thick film portion 23 of the gate insulating film 21 is formed around the thin film portion 22. In the present preferred embodiment, the thick film portion 23 gets across the region separating structures 12 and extends across the plurality of active regions 11. The thick film portion 23 has a thickness T2 larger than the thickness T1 of the thin film portion 22 (T1<T2).

The thickness T2 of the thick film portion 23 may be not less than 20 nm and not more than 50 nm. The thickness T2 may be not less than 20 nm and not more than 25 nm, not less than 25 nm and not more than 30 nm, not less than 30 nm and not more than 35 nm, not less than 35 nm and not more than 40 nm, not less than 40 nm and not more than 45 nm, or not less than 45 nm and not more than 50 nm. The thickness T2 is, in the present preferred embodiment, approximately 30 nm.

The inclined portion 24 of the gate insulating film 21 connects the thin film portion 22 and the thick film portion 23. The inclined portion 24 inclines upward from the thin film portion 22 toward the thick film portion 23. The inclined portion 24 extends in a band shape along the second direction B. The inclined portion 24 gets across the region separating structures 12 and extends across the plurality of active regions 11. The inclined portion 24 may be formed in an annular shape surrounding the thin film portion 22.

A width W2 of the inclined portion 24 is larger than the thickness T2 of the thick film portion 23. The width W2 is a width of the inclined portion 24 along the first direction A. A ratio W2/(T2−T1) of the width W2 of the inclined portion 24 to a difference (T2−T1) between the thickness T2 of the thick film portion 23 and the thickness T1 of the thin film portion 22 may be more than 1 and less than 10 (1<W2/(T2−T1)<10).

The width W2 of the inclined portion 24 may be not less than 100 nm and not more than 200 nm. The width W2 may be not less than 100 nm and not more than 120 nm, not less than 120 nm and not more than 140 nm, not less than 140 nm and not more than 160 nm, not less than 160 nm and not more than 180 nm, or not less than 180 nm and not more than 200 nm. The width W2 is, in the present preferred embodiment, approximately 150 nm.

An angle θ of the inclined portion 24 in the gate insulating film 21 is more than 0° and less than 45° (0°<θ<45'). More specifically, the angle θ is an angle of an inclined surface 26 of the inclined portion 24 to the first main surface 3 in the gate insulating film 21.

The angle θ may be more than 0° and not more than 5°, not less than 5° and not more than 10°, not less than 10° and not more than 15°, not less than 15° and not more than 20°, not less than 20° and not more than 25°, not less than 25° and not more than 30°, not less than 30° and not more than 35°, not less than 35° and not more than 40°, or not less than 40° and less than 45°.

The angle θ is preferably not less than 4° and not more than 12° (4°≤θ≤12°). More preferably, the angle θ is not less than 6° and not more than 10° (6°≤θ≤10°). The angle θ is preferably within a range of 7°±2°.

Referring to FIG. 5, the inclined portion 24 has a first connection end portion 27 connected to the thin film portion 22. The first connection end portion 27 is formed in a concave curved shape toward the first main surface 3. The first connection end portion 27 is smoothly connected to the thin film portion 22 without angulating.

The inclined portion 24 has a second connection end portion 28 connected to the thick film portion 23. The second connection end portion 28 is formed in a convex curved shape toward the opposite side of the first main surface 3. The second connection end portion 28 is smoothly connected to the thick film portion 23 without angulating.

Referring to FIG. 2, a drain connection electrode 31, a source connection electrode 32, a memory gate structure 33, and a select gate structure 34 are formed in each active region 11.

The drain connection electrode 31 is formed on one side in the first direction A across an interval from the thin film portion 22 of the gate insulating film 21. The source connection electrode 32 is formed on the other side in the first direction A across an interval from the thin film portion 22 of the gate insulating film 21. The source connection electrode 32 faces the drain connection electrode 31 across the thin film portion 22 along the first direction A.

The memory gate structure 33 is formed on the gate insulating film 21. The memory gate structure 33 is formed in a region between the drain connection electrode 31 and the source connection electrode 32 in a planar view. The memory gate structure 33 is formed across intervals from the drain connection electrode 31 and the source connection electrode 32 along the first direction A. The memory gate structure 33 is formed in a region on the source connection electrode 32 side in a planar view.

The select gate structure 34 is formed on the gate insulating film 21. The select gate structure 34 is formed in a region between the drain connection electrode 31 and the source connection electrode 32 in a planar view. The select gate structure 34 is formed across intervals from the drain connection electrode 31 and the source connection electrode 32 along the first direction A. The select gate structure 34 is formed in a region on the drain connection electrode 31 side in a planar view.

A distance D between the memory gate structure 33 and the select gate structure 34 may be not less than 200 nm and not more than 400 nm. The distance D may be not less than 200 nm and not more than 250 nm, not less than 250 nm and not more than 300 nm, not less than 300 nm and not more than 350 nm, or not less than 350 nm and not more than 400 nm. The distance D is, in the present preferred embodiment, approximately 300 nm.

More specifically, the memory gate structure 33 is formed in the plurality of active regions 11 so as to cover the thin film portion 22 of the gate insulating film 21, respectively. In the present preferred embodiment, the memory gate structure 33 extends in a band shape along the second direction B, and covers substantially the entire region of the thin film portion 22 of the gate insulating film 21. The memory gate structure 33 gets across the region separating structures 12 and extends across the plurality of active regions 11.

The select gate structure 34 is formed in the plurality of active regions 11 so as to cover the thick film portion 23 of the gate insulating film 21, respectively. In the present preferred embodiment, the select gate structure 34 extends in a band shape along the second direction B. The select gate structure 34 gets across the region separating structures 12 and extends across the plurality of active regions 11.

Referring to FIG. 5, in the present preferred embodiment, the memory gate structure 33 is formed on the thin film portion 22 and the inclined portion 24 of the gate insulating film 21. The memory gate structure 33 exposes a portion positioned on the select gate structure 34 (drain connection electrode 31) side in the inclined portion 24 of the gate insulating film 21. The select gate structure 34 exposes a portion positioned on the select gate structure 34 (drain connection electrode 31) side in the inclined portion 24 of the gate insulating film 21.

That is, a portion positioned on the select gate structure 34 (drain connection electrode 31) side of the second connection end portions 28 of the inclined portion 24 is positioned in a region between the memory gate structure 33 and the select gate structure 34. The second connection end portion 28 of the inclined portion 24 is exposed from the region between the memory gate structure 33 and the select gate structure 34.

A side surface of the memory gate structure 33 includes a first side surface connection portion 35 in contact with the inclined portion 24 of the gate insulating film 21. Aside surface of the select gate structure 34 includes a second side surface connection portion 36 in contact with the thick film portion 23 of the gate insulating film 21. The second side surface connection portion 36 is positioned higher than the first side surface connection portion 35 with respect to the first main surface 3. A distance between the first main surface 3 and the second side surface connection portion 36 is larger than a distance between the first main surface 3 and the first side surface connection portion 35.

A first outer surface insulating film 37 is formed on the memory gate structure 33. The first outer surface insulating film 37 exposes a portion of an upper surface of the memory gate structure 33. A second outer surface insulating film 38 is formed on the select gate structure 34. The second outer surface insulating film 38 exposes a portion of an upper surface of the select gate structure 34.

Side surfaces of the memory gate structure 33 are covered by a first side wall 39. The first side wall 39 is in contact with the inclined portion 24 of the gate insulating film 21.

Side surfaces of the select gate structure 34 are covered by a second side wall 40. The second side wall 40 is in contact with the thick film portion 23 of the gate insulating film 21. The second side wall 40 may be in contact with inclined portion 24 of the gate insulating film 21. The second side wall 40 may be formed integrally with the first side wall 39 in the region between the select gate structure 34 and the memory gate structure 33.

Referring to FIG. 2 to FIG. 4, the memory gate structure 33 has a laminated structure including a plurality of first floating gate layers 51, a first intermediate insulating layer 52, and a control gate layer 53 laminated in this order from the gate insulating film 21 side. In FIG. 2, the first floating gate layers 51 are shown by hatching.

The plurality of first floating gate layers 51 are formed at intervals along the second direction B. The plurality of first floating gate layers 51 respectively cover the thin film portion 22 of the gate insulating film 21 in the active regions 11.

Each first floating gate layer 51 includes a main body portion 51A covering the active region 11, and an overlap portion 51B covering the region separating structure 12. The overlap portion 51B covers a peripheral edge portion of an adjacent region separating structure 12.

A thickness of the first floating gate layer 51 may be not less than 100 nm and not more than 200 nm. The thickness of the first floating gate layer 51 may be not less than 100 nm and not more than 120 nm, not less than 120 nm and not more than 140 nm, not less than 140 nm and not more than 160 nm, not less than 160 nm and not more than 180 nm, or not less than 180 nm and not more than 200 nm. The thickness of the first floating layer 51 is, in the present preferred embodiment, approximately 150 nm.

The first intermediate insulating layer 52 extends in a band shape along the second direction B. The first intermediate insulating layer 52 gets across the region separating structures 12 and extends across the plurality of active regions 11. The first intermediate insulating layer 52 collectively covers the plurality of first floating gate layers 51.

The first intermediate insulating layer 52 may have an ONO structure. The ONO structure includes a silicon oxide film, a silicon nitride film, and a silicon oxide film laminated in this order from the first floating gate layer 51 side.

A thickness of the first intermediate insulating layer 52 may be not less than 10 nm and not more than 30 nm. The thickness of the first intermediate insulating layer 52 may be not less than 10 nm and not more than 15 nm, not less than 15 nm and not more than 20 nm, not less than 20 nm and not more than 25 nm, or not less than 25 nm and not more than 30 nm. The thickness of the first intermediate insulating layer 52 is, in the present preferred embodiment, approximately 30 nm. The thickness of the first intermediate insulating layer 52 is, in the present preferred embodiment, approximately 20 nm.

The control gate layer 53 extends in a band shape along the second direction B. The control gate layer 53 gets across the region separating structures 12 and extends across the plurality of active regions 11. The control gate layer 53 collectively covers the plurality of first floating gate layers 51 via the first intermediate insulating layer 52. The control gate layer 53 forms a common control gate layer to the plurality of active regions 11.

Side surfaces of the control gate layer 53 extending along the second direction B are formed to be flush with side surfaces of the first floating gate layers 51 extending along the second direction B.

A thickness of the control gate layer 53 may be not less than 50 nm and not more than 150 nm. The thickness of the control gate layer 53 may be not less than 50 nm and not more than 70 nm, not less than 70 nm and not more than 90 nm, not less than 90 nm and not more than 110 nm, not less than 110 nm and not more than 130 nm, or not less than 130 nm and not more than 150 nm. The thickness of the control gate layer 53 is, in the present preferred embodiment, approximately 100 nm.

Referring to FIG. 2 to FIG. 4, the select gate structure 34 has a laminated structure including a select gate layer 54, a second intermediate insulating layer 55, and a second floating gate layer 56 laminated in this order from the gate insulating film 21 side. In FIG. 2, the second floating gate layer 56 is shown by hatching.

The select gate layer 54 extends in a band shape along the second direction B. The select gate layer 54 gets across the region separating structures 12 and extends across the plurality of active regions 11. The select gate layer 54 forms a common select gate layer to the plurality of active regions 11.

A thickness of the select gate layer 54 may be not less than 100 nm and not more than 200 nm. The thickness of the select gate layer 54 may be not less than 100 nm and not more than 120 nm, not less than 120 nm and not more than 140 nm, not less than 140 nm and not more than 160 nm, not less than 160 nm and not more than 180 nm, or not less than 180 nm and not more than 200 nm. The thickness of the select gate layer 54 is, in the present preferred embodiment, approximately 150 nm. The thickness of the select gate layer 54 may be substantially equal to the thickness of the first floating gate layer 51.

The second intermediate insulating layer 55 covers substantially the entire region of the select gate layer 54. The second intermediate insulating layer 55 extends in a band shape along the second direction B. The second intermediate insulating layer 55 gets across the region separating structures 12 and extends across the plurality of active regions 11.

The second intermediate insulating layer 55 may have an ONO structure. The ONO structure includes a silicon oxide film, a silicon nitride film, and a silicon oxide film laminated in this order from the select gate layer 54 side.

A thickness of the second intermediate insulating layer 55 may be not less than 10 nm and not more than 30 nm. The thickness of the second intermediate insulating layer 55 may be not less than 10 nm and not more than 15 nm, not less than 15 nm and not more than 20 nm, not less than 20 nm and not more than 25 nm, or not less than 25 nm and not more than 30 nm. The thickness of the second intermediate insulating layer 55 is, in the present preferred embodiment, approximately 30 nm. The thickness of the second intermediate insulating layer 55 is, in the present preferred embodiment, approximately 20 nm. The thickness of the second intermediate insulating layer 55 may be substantially equal to the thickness of the first intermediate insulating layer 52.

The second floating gate layer 56 covers substantially the entire region of the second intermediate insulating layer 55. The second floating gate layer 56 extends in a band shape along the second direction B. The second floating layer 56 gets across the region separating structures 12 and extends across the plurality of active regions 11. Side surfaces of the second floating gate layer 56 extending along the second direction B are formed to be flush with side surfaces of the select gate layer 54 extending along the second direction B.

A thickness of the second floating gate layer 56 may be not less than 50 nm and not more than 150 nm. The thickness of the second floating gate layer 56 may be not less than 50 nm and not more than 70 nm, not less than 70 nm and not more than 90 nm, not less than 90 nm and not more than 110 nm, not less than 110 nm and not more than 130 nm, or not less than 130 nm and not more than 150 nm. The thickness of the second floating gate layer 56 is, in the present preferred embodiment, approximately 100 nm. The thickness of the second floating gate layer 56 may be substantially equal to the thickness of the control gate layer 53.

Referring to FIG. 3 and FIG. 4, a tunnel region 61 of an n-type is formed at the surface layer portion of the first main surface 3 in each active region 11. The tunnel region 61 is formed in a region that faces the memory gate 33 across the thin film portion 22 of the gate insulating film 21 at the surface layer portion of the first main surface 3. The tunnel region 61 overlaps the entire region of a portion positioned within the active region 11 in the thin film portion 22 of the gate insulating film 21 in a planar view.

The tunnel region 61 may overlap the inclined portion 24 of the gate insulating film 21 in a planar view. In a planar view, the tunnel region 61 may overlap the entire region of the inclined portion 24 of the gate insulating film 21 positioned in the active region 11. The tunnel region 61 may overlap the thick film portion 23 of the gate insulating film 21.

An n-type impurity concentration of the tunnel region 61 may be not less than $1.0 \times 10^{17}$ cm$^{-3}$ and not more than $1.0 \times 10^{20}$ cm$^{-3}$. A depth of the tunnel region 61 may be not less than 0.2 μm and not more than 0.5 μm.

The tunnel region 61 functions as a drain region of the n-type of the memory gate structure 33. The tunnel region 61 functions as a source region of the n-type of the select gate structure 34. The memory gate structure 33 and the select gate structure 34 are connected in series via the tunnel region 61.

A tunnel low-concentration region 62 of the n-type is formed at the surface layer portion of the first main surface 3 in each active region 11. The tunnel low-concentration region 62 has an n-type impurity concentration lower than that of the tunnel region 61. The n-type impurity concentration of the tunnel low-concentration region 62 may be not less than $1.0 \times 10^{16}$ cm$^{-3}$ and not more than $1.0 \times 10^{19}$ cm$^{-3}$.

The tunnel low-concentration region 62 is formed in a region between the memory gate structure 33 and the select gate structure 34 at the surface layer portion of the first main surface 3. The tunnel low-concentration region 62 is formed in a self-aligned manner with respect to the memory gate structure 33 and the select gate structure 34. The tunnel low-concentration region 62 overlaps the first side wall 39 and the second side wall 40 in a planar view.

The tunnel low-concentration region 62 is connected to the tunnel region 61. A bottom portion of the tunnel low-concentration region 62 may be positioned in a region on the second main surface 4 side with respect to the bottom portion of the tunnel region 61. The tunnel low-concentration region 62 may include an overlap portion 62A covering the bottom portion of the tunnel region 61. A depth of the tunnel low-concentration region 62 may be not less than 0.1 μm and not more than 0.3 μm.

A source region 63 of the n-type is formed at the surface layer portion of the first main surface 3 in each active region 11. The source region 63 functions as a source of the memory gate structure 33. The source region 63 is formed in a region on the opposite side of the tunnel region 61 with respect to the memory gate structure 33 at the surface layer portion of the first main surface 3. The source region 63 overlaps the first side wall 39 in a planar view.

The source region 63 has an LDS (Lightly Doped Source) structure including a source low-concentration region 65 of the n-type and a source high-concentration region 66 of the n-type. The source high-concentration region 66 has an n-type impurity concentration higher than that of the source low-concentration region 65.

The n-type impurity concentration of the source low-concentration region 65 may be not less than $1.0 \times 10^{16}$ cm$^{-3}$ and not more than $1.0 \times 10^{19}$ cm$^{-3}$. The n-type impurity concentration of the source high-concentration region 66 may be not less than $1.0 \times 10^{17}$ cm$^{-3}$ and not more than $1.0 \times 10^{20}$ cm$^{-3}$.

The source low-concentration region 65 is formed at the surface layer portion of the first main surface 3. The source low-concentration region 65 is formed in a self-aligned manner with respect to the memory gate structure 33. The source high-concentration region 66 is formed at a surface layer portion of the source low-concentration region 65. The source high-concentration region 66 is formed in a self-aligned manner with respect to the first side wall 39.

A drain region 64 of the n-type is formed at the surface layer portion of the first main surface 3 in each active region 11. The drain region 64 functions as a drain of the select gate structure 34. The drain region 64 is formed in a region on the opposite side of the tunnel region 61 with respect to the select gate structure 34 at the surface layer portion of the first main surface 3. The drain region 64 overlaps the second side wall 40 in a planar view.

The drain region 64 has an LDD (Lightly Doped Drain) structure including a drain low-concentration region 67 of the n-type and a drain high-concentration region 68 of the n-type. The drain high-concentration region 68 has an n-type impurity concentration higher than that of the drain low-concentration region 67.

The n-type impurity concentration of the drain low-concentration region 67 may be not less than $1.0 \times 10^{16}$ cm$^{-3}$ and not more than $1.0 \times 10^{19}$ cm$^{-3}$. The n-type impurity concentration of the drain high-concentration region 68 may be not less than $1.0 \times 10^{17}$ cm$^{-3}$ and not more than $1.0 \times 10^{20}$ cm$^{-3}$.

The drain low-concentration region 67 is formed at the surface layer portion of the first main surface 3. The drain low-concentration region 67 is formed in a self-aligned manner with respect to the select gate structure 34. The drain high-concentration region 68 is formed at a surface layer portion of the drain low-concentration region 67. The drain high-concentration region 68 is formed in a self-aligned manner with respect to the second side wall 40.

A protective insulating layer 71 is formed on the front surface of the first main surface 3. The protective insulating layer 71 may include silicon nitride. The protective insulating layer 71 is formed in a film shape along the first main surface 3, an outer surface of the memory gate structure 33, an outer surface of the select gate structure 34, an outer surface of the first side wall 39, and an outer surface of the second side wall 40.

An interlayer insulating layer 72 is formed on the protective insulating layer 71. The interlayer insulating layer 72 covers the memory gate structure 33, the select gate structure 34, the first side wall 39, and the second side wall 40 across the protective insulating layer 71.

The interlayer insulating layer 72 may have a single-layer structure including a single insulating layer. The interlayer insulating layer 72 may have a laminated structure including a plurality of laminated insulating layers. The interlayer insulating layer 72 may include silicon oxide or silicon nitride.

A drain silicide layer 73 is formed at a surface layer portion of the drain region 64. A source silicide layer 74 is formed at a surface layer portion of the source region 63. A first gate silicide layer 75 is formed in a surface layer portion of the control gate layer 53. A second gate silicide layer 76 is formed in a surface layer portion of the second floating gate layer 56.

The drain connection electrode 31 described above is connected to the drain region 64 by penetrating through the interlayer insulating layer 72. The drain connection electrode 31 is connected to the drain region 64 via the drain silicide layer 73.

The source connection electrode 32 described above is connected to the source region 63 by penetrating through the interlayer insulating layer 72. The source connection electrode 32 is connected to the source region 63 via the source silicide layer 74.

A first gate connection electrode for the memory gate structure 33 is formed in the interlayer insulating layer 72 although not shown. The first gate connection electrode is connected to the control gate layer 53 of the memory gate structure 33 by penetrating through the interlayer insulating layer 72. The first gate connection electrode is connected to the control gate layer 53 via the first gate silicide layer 75.

A second gate connection electrode for the select gate structure 34 is also formed in the interlayer insulating layer 72. The second gate connection electrode is connected to the second floating gate layer 56 of the select gate structure 34 by penetrating through the interlayer insulating layer 72. The second gate connection electrode is connected to the control gate layer 53 via the second gate silicide layer 76.

The drain connection electrode 31, the source connection electrode 32, the first gate connection electrode, and the second gate connection electrode respectively include a contact electrode layer 77 and a wiring electrode layer 78.

The contact electrode layer 77 is embedded in a contact hole 79 formed in the interlayer insulating layer 72. The contact electrode layer 77 includes a base electrode layer 80 and an embedded electrode layer 81. The base electrode layer 80 may include titanium. The embedded electrode layer 81 may include tungsten.

The base electrode layer 80 is formed in a film shape along an inner wall surface of the contact hole 79. The base electrode layer 80 demarcates a recessed space inside the contact hole 79. The embedded electrode layer 81 is embedded in the contact hole 79 across the base electrode layer 80. More specifically, the embedded electrode layer 81 is embedded in the recessed space demarcated by the base electrode layer 80.

The wiring electrode layer 78 is formed on the interlayer insulating layer 72 so as to cover the contact electrode layer 77. The wiring electrode layer 78 has a laminated structure including a first electrode layer 82, a second electrode layer 83, and a third electrode layer 84 laminated in this order from the contact electrode layer 77 side. The first electrode layer 82 may include titanium. The second electrode layer 83 may include aluminum. The third electrode layer 84 may include titanium.

As described above, according to the semiconductor device 1, the thin film portion 22 and the thick film portion 23 are connected by the inclined portion 24 in the gate insulating film 21. Accordingly, it is possible to suppress formation of an angle portion in the region between the thin film portion 22 and the thick film portion 23, so that electric field concentration at the gate insulating film 21 can be relaxed. Therefore, it is possible to suppress deterioration of electric characteristics, such as deterioration of dielectric breakdown strength and a decrease in charge amount passing through the thin film portion 22.

In particular, according to the semiconductor device 1, the angle θ of the inclined portion 24 in the gate insulating film 21 is less than 45°. More specifically, the angle θ is set to be not less than 4° and not more than 12° (4°≤θ≤12°) extremely small as compared with 45°.

Moreover, the inclined portion 24 has the first connection end portion 27 connected to the thin film portion 22. The first connection end portion 27 is smoothly connected to the thin film portion 22. The inclined portion 24 also has the second connection end portion 28 connected to the thick film portion 23. The second connection end portion 28 is smoothly connected to the thick film portion 23. These structures are effective to appropriately relax electric field concentration at the gate insulating film 21.

Figure 6G:
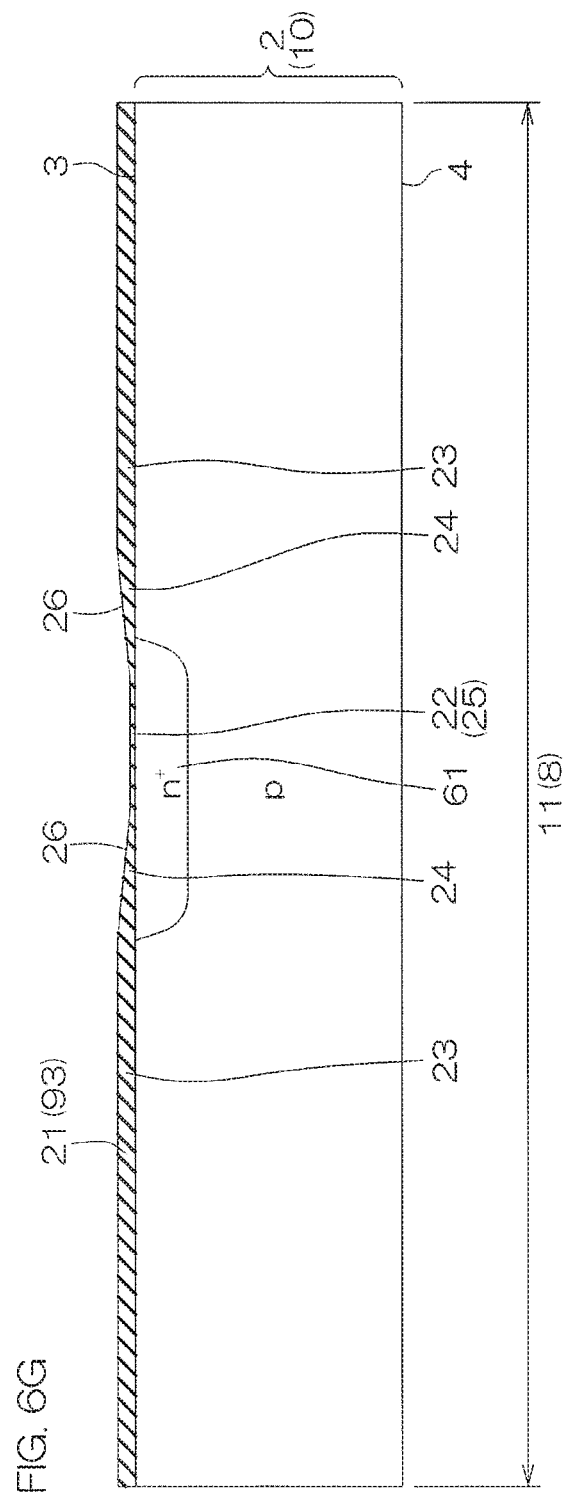
FIG. 6A to FIG. 6T are sectional views of a portion corresponding to FIG. 3, and are sectional views to describe a method of manufacturing the semiconductor device shown in FIG. 1.

FIG. 6A to FIG. 6T are sectional views of a portion corresponding to FIG. 3, and are sectional views to describe an example of a manufacturing process of the semiconductor device 1. FIG. 7A to FIG. 7T are sectional views of a portion corresponding to FIG. 4, and are sectional views to describe an example of the manufacturing process of the semiconductor device 1.

Referring to FIG. 6A and FIG. 7A, first, the semiconductor layer 2 having the first main surface 3 and the second main surface 4 is prepared. Next, a mask 91 having a predetermined pattern is formed on the first main surface 3. The mask 91 has a plurality of openings 92 exposing regions in which the trenches 13 are to be formed.

Next, referring to FIG. 6B and FIG. 7B, unnecessary portions of the semiconductor layer 2 are removed by an etching method through the mask 91. Accordingly, a plurality of trenches 13 are formed in the semiconductor layer 2. Thereafter, the mask 91 is removed.

Next, referring to FIG. 6C and FIG. 7C, the field stop region 15 is formed in a region along the bottom wall of each trench 13 in the semiconductor layer 2. In this forming step, a p-type impurity is doped into the region along the bottom wall of each trench 13 in the semiconductor layer 2. The p-type impurity is doped by an ion implantation method through an ion implantation mask. Accordingly, the field stop regions 15 are formed.

Next, the insulator layer 14 is embedded in the trenches 13. In this step, first, the insulator layer 14 that fills the trenches 13 and covers the first main surface 3 is formed. The insulator layer 14 may be formed by a chemical vapor deposition (CVD) method.

Next, unnecessary portions of the insulator layer 14 are removed. The insulator layer 14 may be removed until the first main surface 3 is exposed. The insulator layer 14 may be removed by an etch back method and/or a chemical mechanical polishing (CMP) method.

Next, the tunnel regions 61 are formed at the surface layer portion of the first main surface 3. In this forming step, an n-type impurity is doped into the surface layer portion of the first main surface 3 is doped. The n-type impurity is doped by the ion implantation method through an ion implantation mask. Accordingly, the tunnel regions 61 are formed.

Figure 7D:
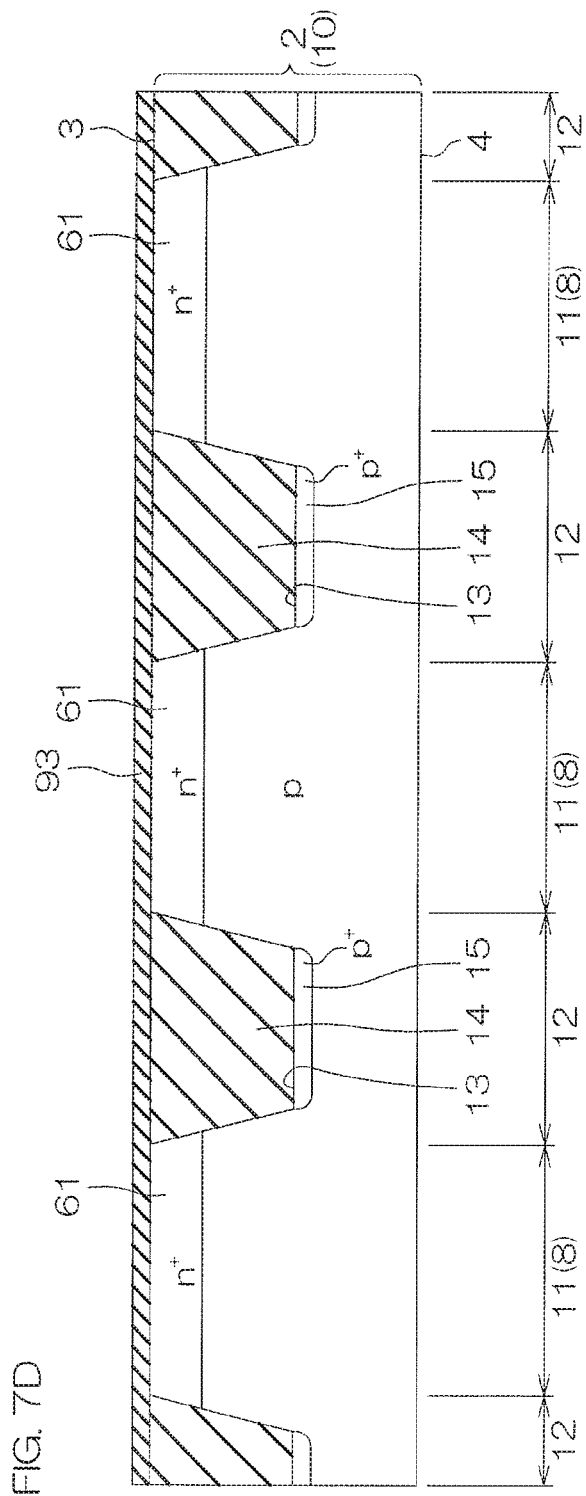
FIG. 7A to FIG. 7T are sectional views of a portion corresponding to FIG. 4, and are sectional views to describe the method of manufacturing the semiconductor device shown in FIG. 1.

Next, referring to FIG. 6D and FIG. 7D, a first base insulating film 93 to be a base of the gate insulating film 21 is formed on the first main surface 3. The first base insulating film 93 may be formed by applying an oxidation treatment method (for example, the thermal oxidation treatment method) to the first main surface 3. A thickness of the first base insulating film 93 may be approximately 0.03 μm.

Figure 7E:
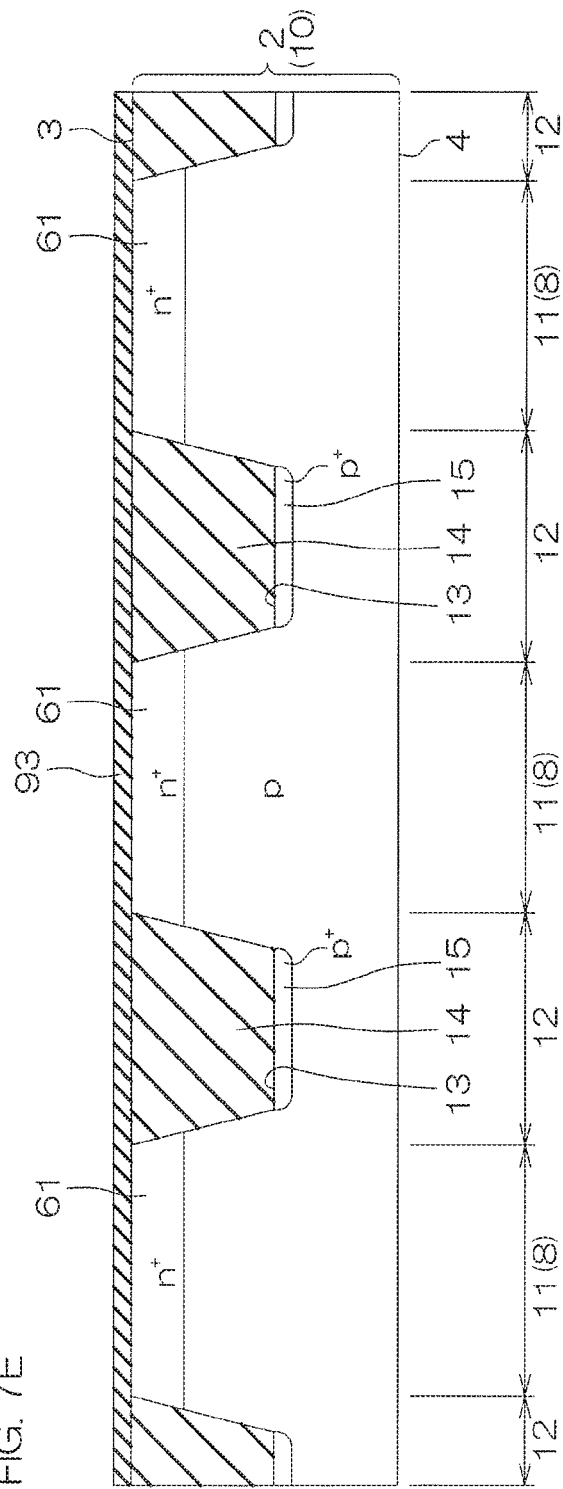

Next, referring to FIG. 6E and FIG. 7E, a resist mask 94 having a predetermined pattern is formed on the first base insulating film 93. The resist mask 94 has an opening 95 exposing a region in which the thin film portion 22 is to be formed.

The opening 95 is formed by selectively exposing the resist mask 94 by a photolithography method and then developing the resist mask 94. Exposure to be applied to the resist mask 94 may be performed by a short-wavelength laser irradiation method using a photomask. The exposing step using the short-wavelength laser irradiation method includes a step of adjusting adhesion of the resist mask 94 to the first base insulating film 93.

The short-wavelength laser may include an ultraviolet laser having a wavelength not less than 150 nm and not more than 400 nm. The ultraviolet laser may include at least one kind among an ArF excimer laser, a KrF excimer laser, and an XeCl excimer laser and XeF excimer laser.

The ArF excimer laser has a wavelength not less than 188 nm and not more than 198 nm (more specifically, 193 nm). The KrF excimer laser has a wavelength not less than 243 nm and not more than 253 nm (more specifically, 248 nm). The XeCl excimer laser has a wavelength not less than 303 nm and not more than 313 nm (more specifically, 308 nm). The XeF excimer laser has a wavelength not less than 346 nm and not more than 356 nm (more specifically, 351 nm).

Among these laser kinds, the ultraviolet laser preferably consists of the KrF excimer laser. By the short-wavelength laser irradiation method using a photomask, adhesion of the resist mask 94 to the first base insulating film 93 can be appropriately adjusted. Accordingly, at the time of a step of removing the first base insulating film 93 described later, the first base insulating film 93 can appropriately be processed into a desired shape.

Figure 7F:
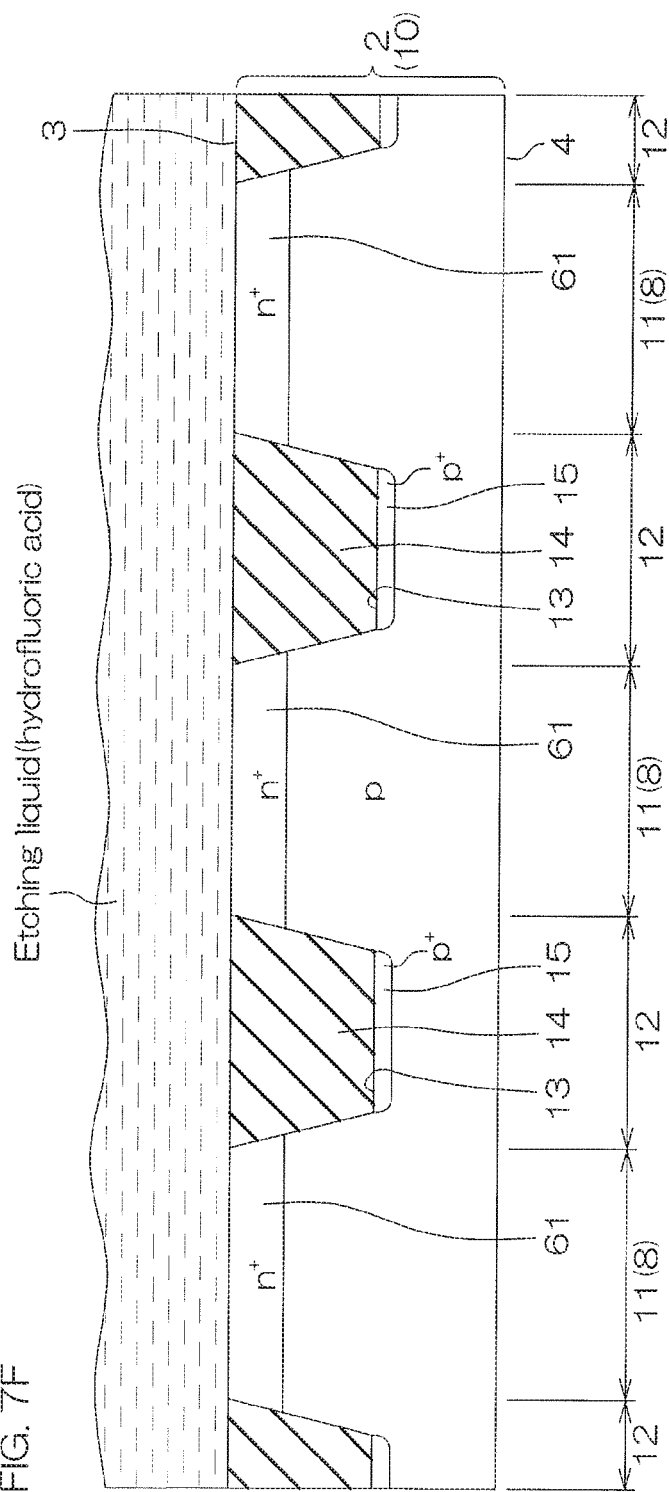

Next, referring to FIG. 6F and FIG. 7F, unnecessary portions of the first base insulating film 93 are removed. The first base insulating film 93 may be removed by a wet etching method through a resist mask 94. Hydrofluoric acid may be used as an etching liquid.

Accordingly, the first base insulating film 93 exposed from the resist mask 94 is removed. In this step, the etching liquid permeates the region between the resist mask 94 and the first base insulating film 93. The etching liquid permeates the region between the resist mask 94 and the first base insulating film 93 in a horizontal direction parallel to the first main surface 3.

Permeability (amount of permeation) of the etching liquid differs depending on adhesiveness of the resist mask 94 to the first base insulating film 93. Permeability (amount of permeation) of the etching liquid gradually decreases with increasing distance from the opening 95 of the resist mask 94.

Accordingly, at a portion of the first base insulating film 93 positioned in the region between the resist mask 94 and the first base insulating film 93, the inclined portion 24 inclined downwardly toward the opening 95 side is formed. The structure of the inclined portion 24 is as described above by referring to FIG. 5, etc., so that detailed description of the inclined portion 24 is omitted. After the inclined portion 24 is formed, the resist mask 94 is removed.

Figure 7G:
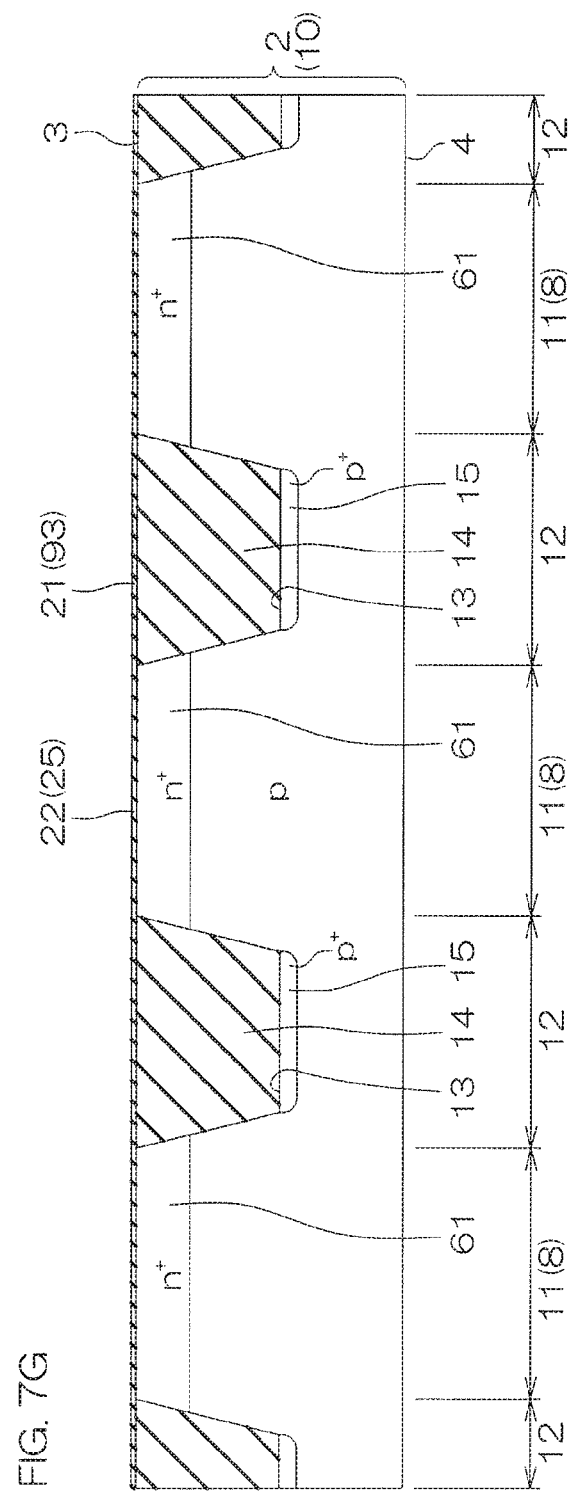

Next, referring to FIG. 6G and FIG. 7G, the thin film portion 22 is formed on the first main surface 3 exposed from the first base insulating film 93. The thin film portion 22 may be formed by the oxidation treatment method (for example, the thermal oxidation treatment method). In this way, the gate insulating film 21 having the thin film portion 22, the thick film portion 23, and the inclined portion 24 is formed.

Figure 6H:
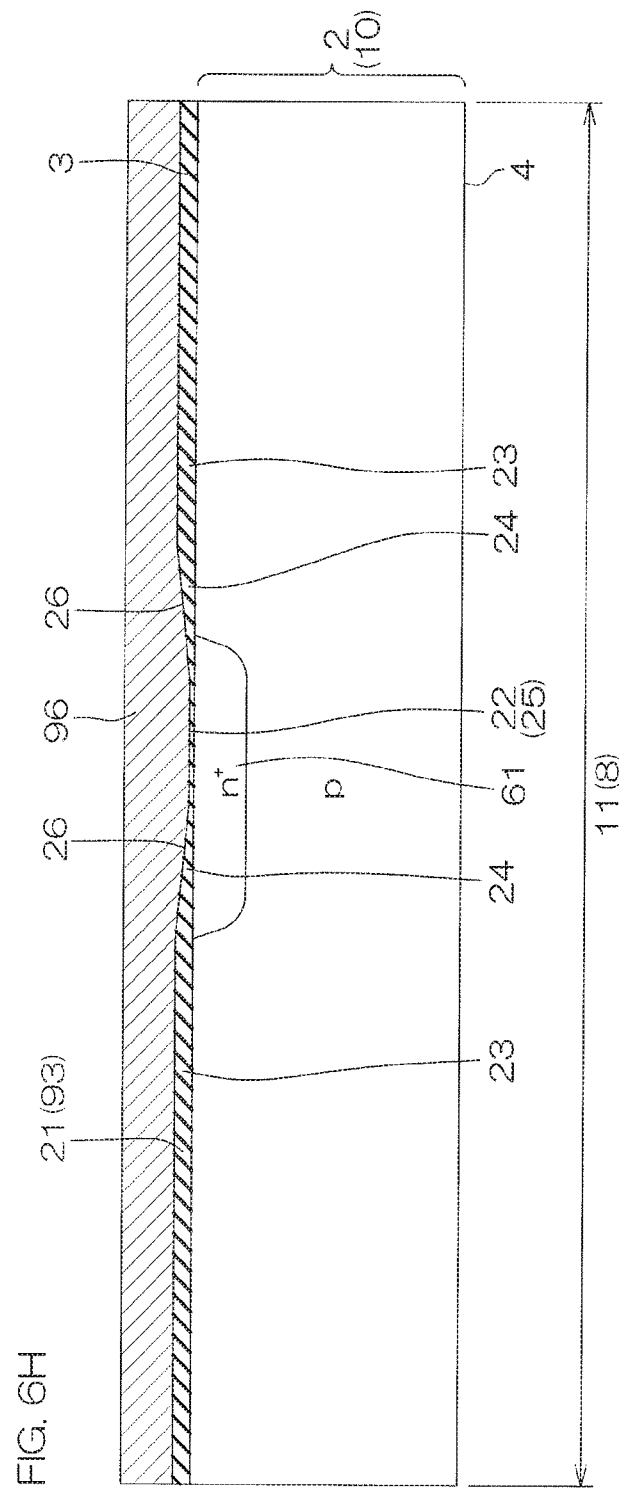
Figure 7H:
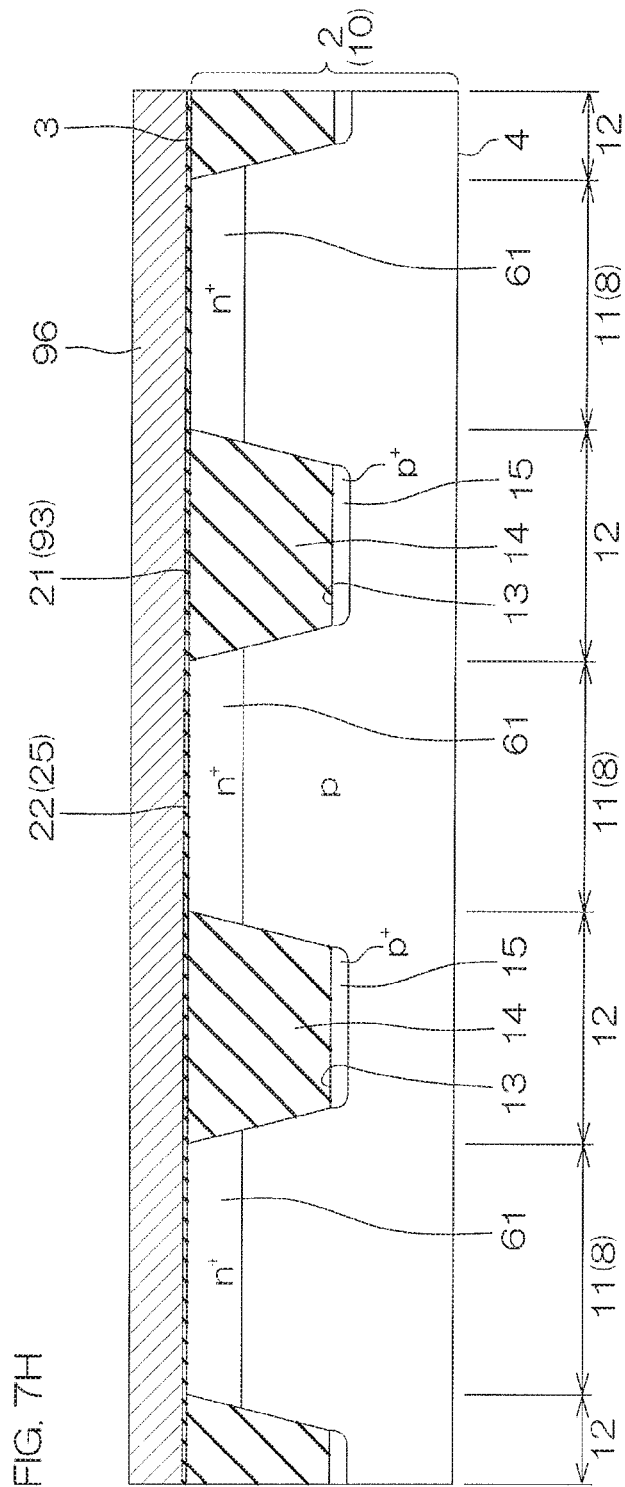

Next, referring to FIG. 6H and FIG. 7H, a first base conductor layer 96 to be a base of the first floating gate layers 51 and the select gate layer 54 is formed. In the present preferred embodiment, the first base conductor layer 96 including conductive polysilicon is formed. Conductivity may be provided to polysilicon by an n-type impurity (for example, phosphorus).

Figure 6I:
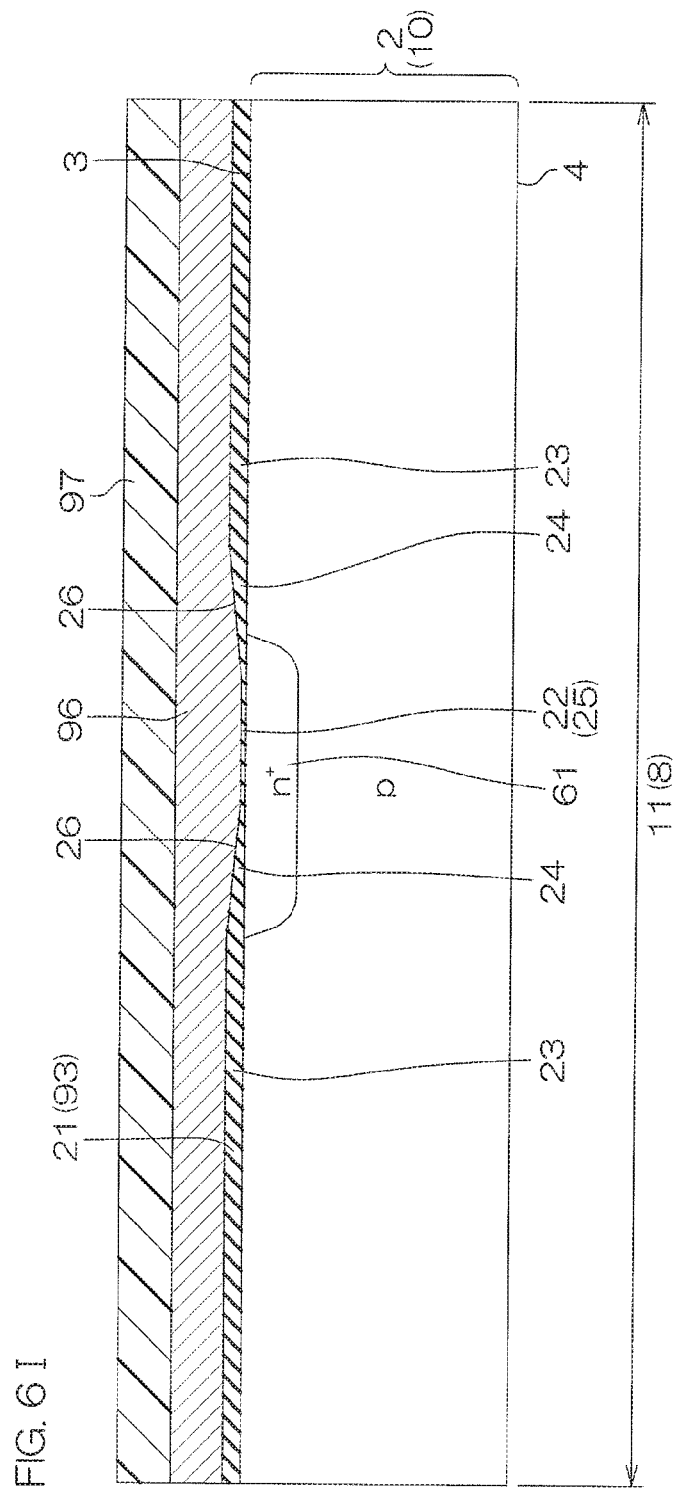
Figure 7I:
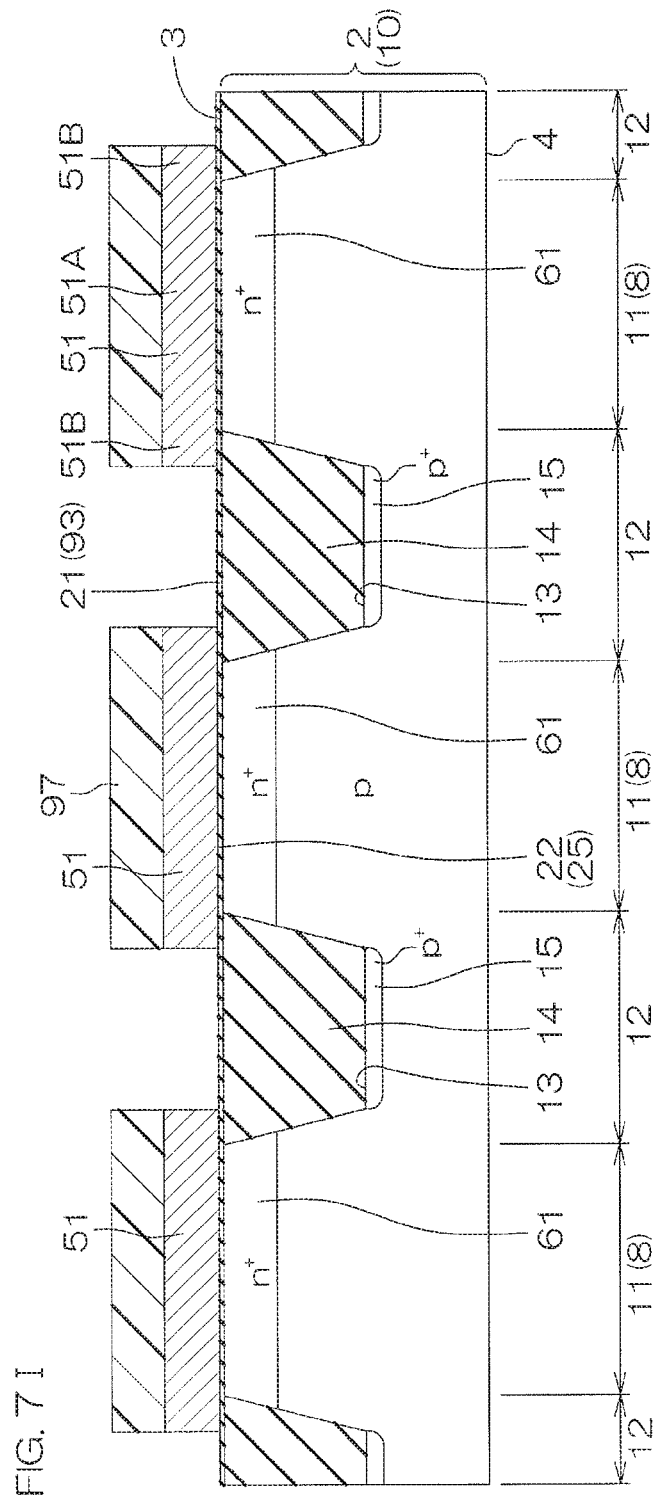

Next, referring to FIG. 6I and FIG. 7I, a mask 97 having a predetermined pattern is formed on the first base conductor layer 96. The mask 97 covers regions in which the first floating gate layers 51 and the select gate layer 54 are to be formed, and exposes other regions.

Next, unnecessary portions of the first base conductor layer 96 are removed by an etching method through the mask 97. Accordingly, the first floating gate layers 51 and the select gate layer 54 are formed. Thereafter, the mask 97 is removed.

Figure 6J:
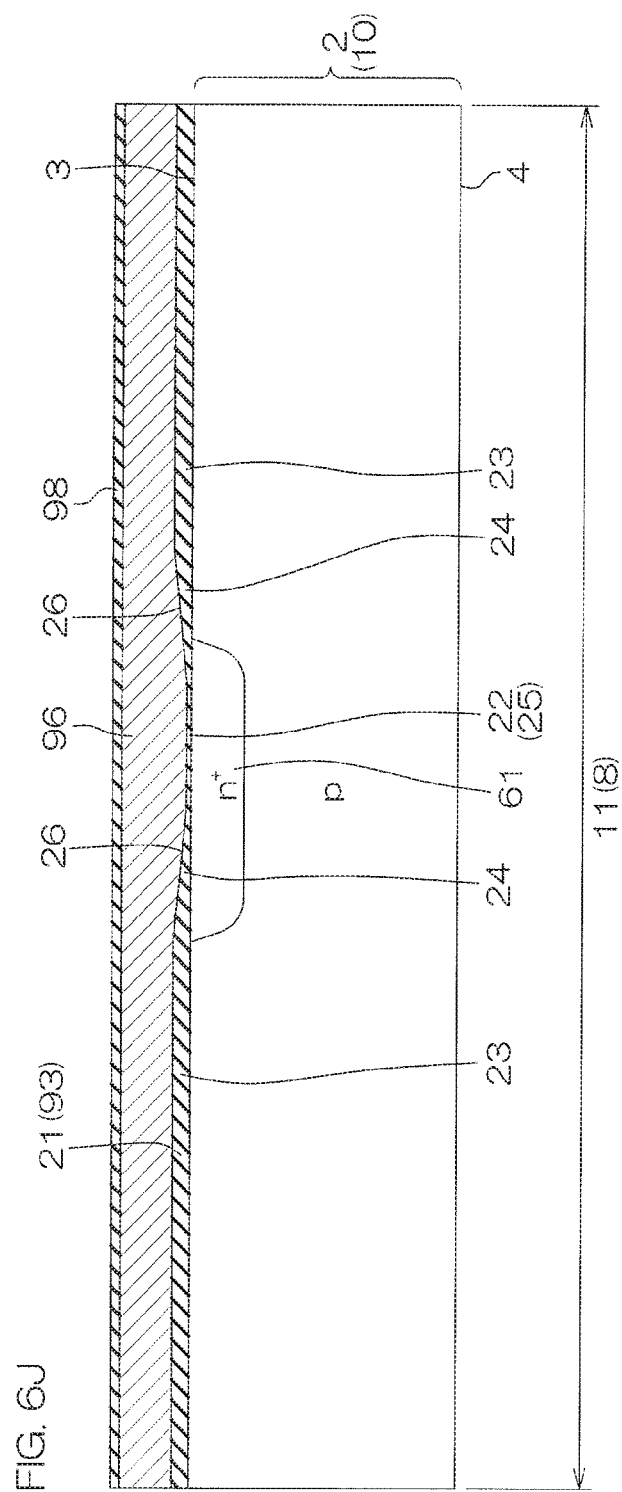
Figure 7J:
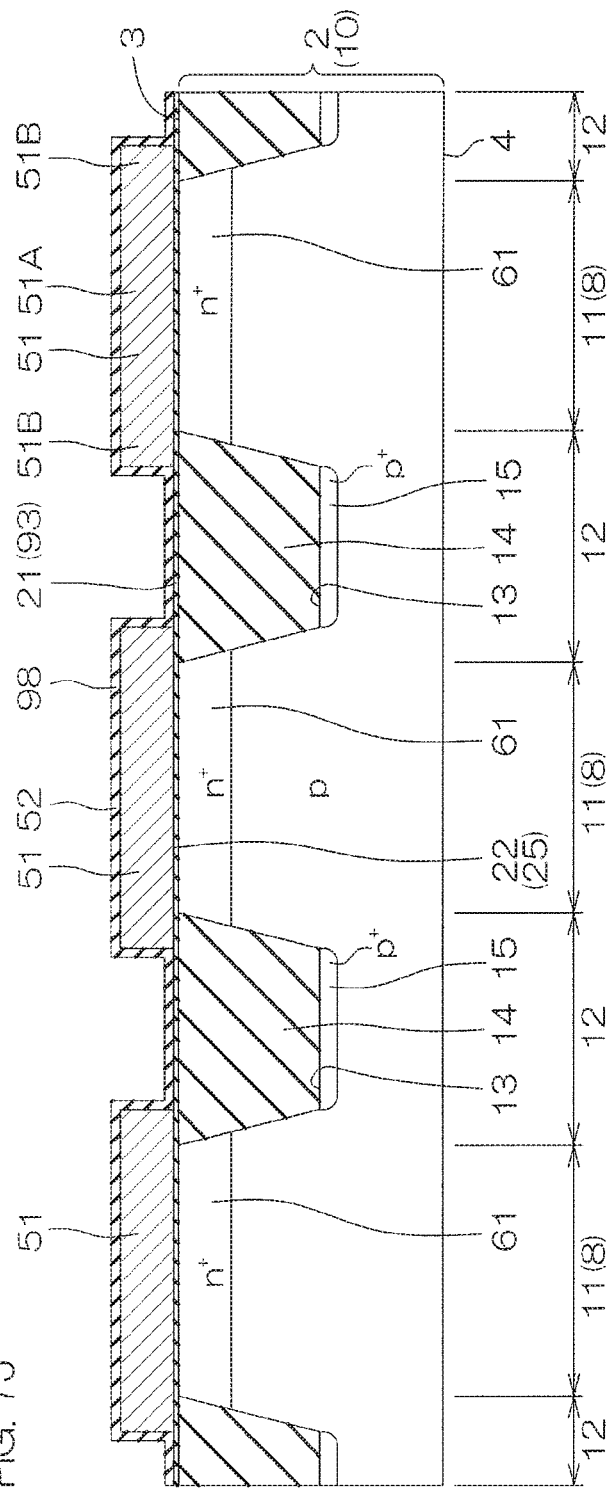

Next, referring to FIG. 6J and FIG. 7J, a base intermediate insulating layer 98 to be a base of the first intermediate insulating layer 52 and the second intermediate insulating layer 55 is formed on the first main surface 3. In this step, a silicon oxide film, a silicon nitride film, and a silicon oxide film are formed in this order. The silicon oxide film, the silicon nitride film, and the silicon oxide film may be respectively formed by the CVD method.

Figure 6K:
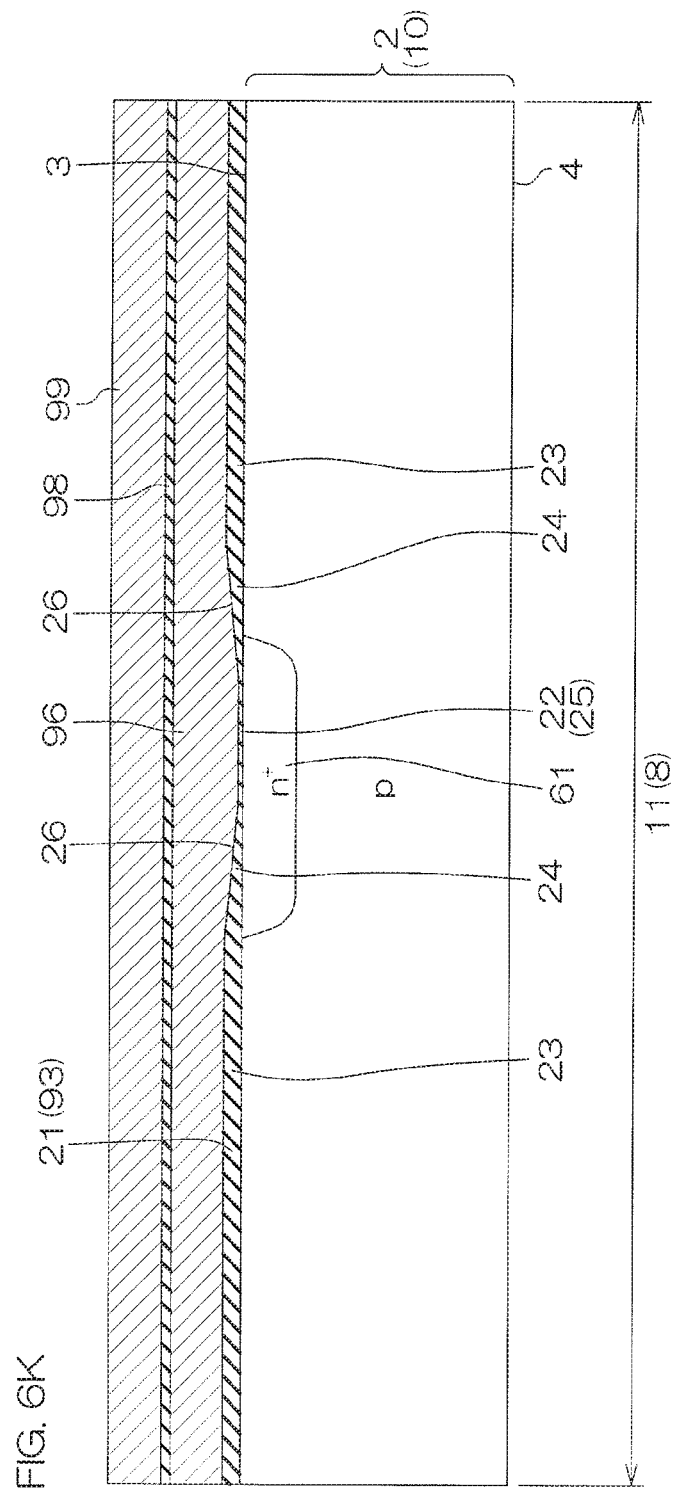
Figure 7K:
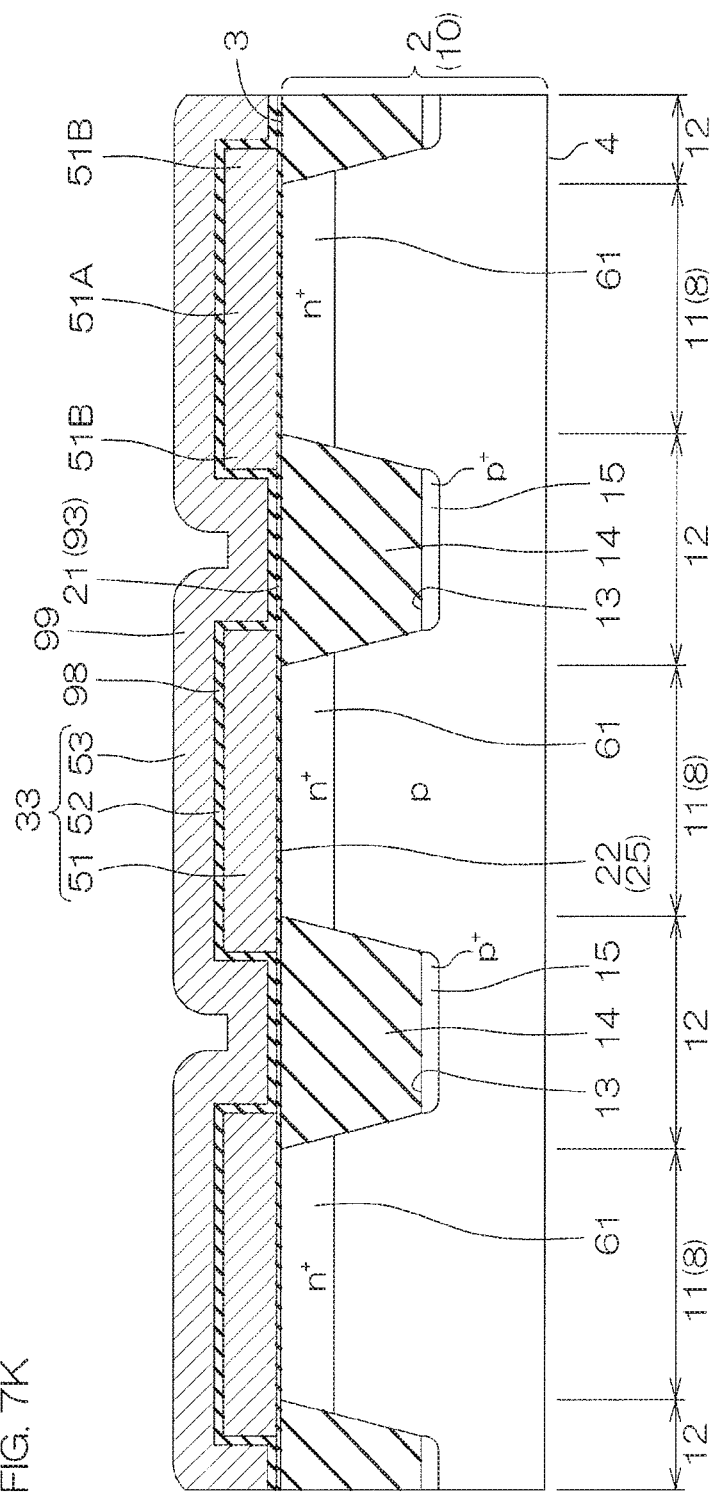

Next, referring to FIG. 6K and FIG. 7K, a second base conductor layer 99 to be a base of the control gate layer 53 and the second floating gate layer 56 is formed. In the present preferred embodiment, the second base conductor layer 99 including conductive polysilicon is formed. Conductivity may be provided to polysilicon by an n-type impurity (for example, phosphorus).

Figure 7L:
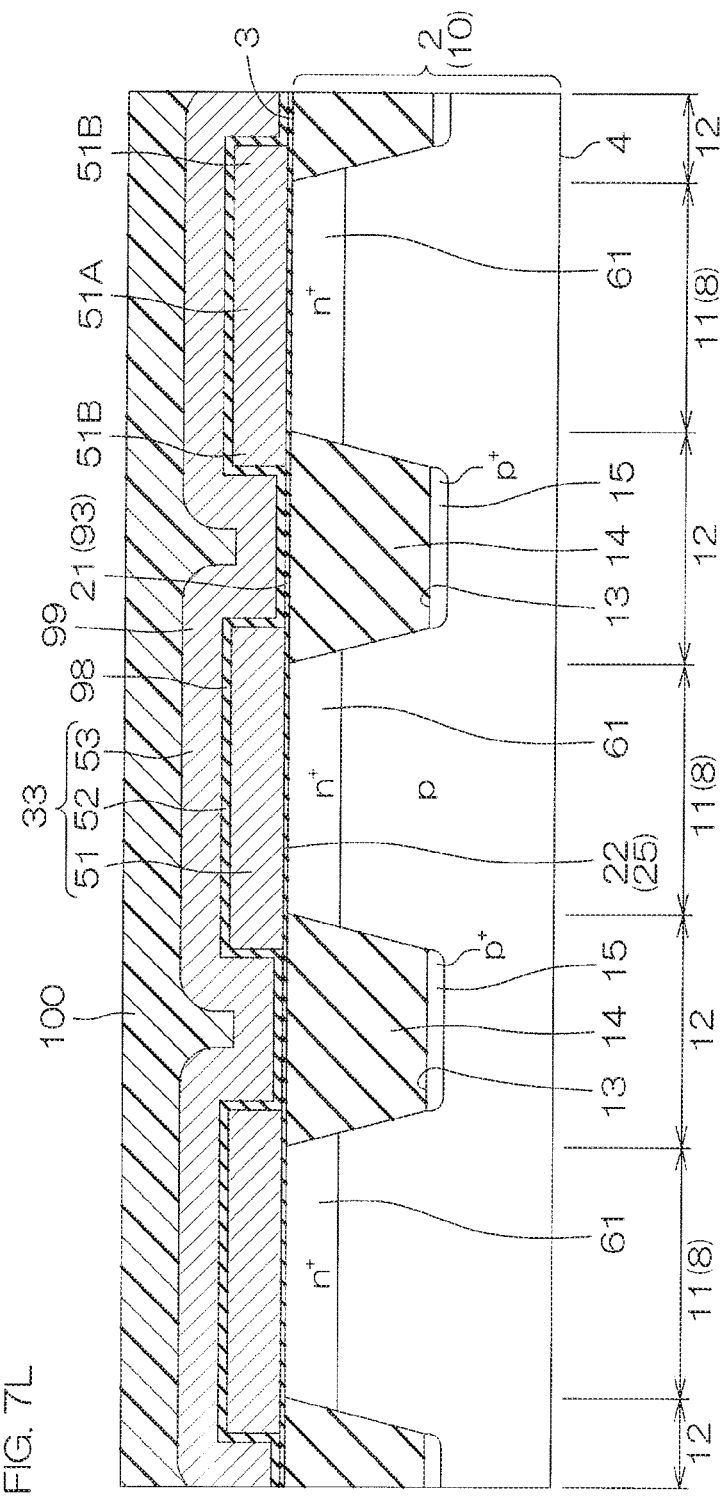

Next, referring to FIG. 6L and FIG. 7L, a mask 100 having a predetermined pattern is formed on the second base conductor layer 99. The mask 100 covers regions in which the control gate layer 53 and the second floating gate layer 56 are to be formed, and exposes other regions.

Figure 7M:
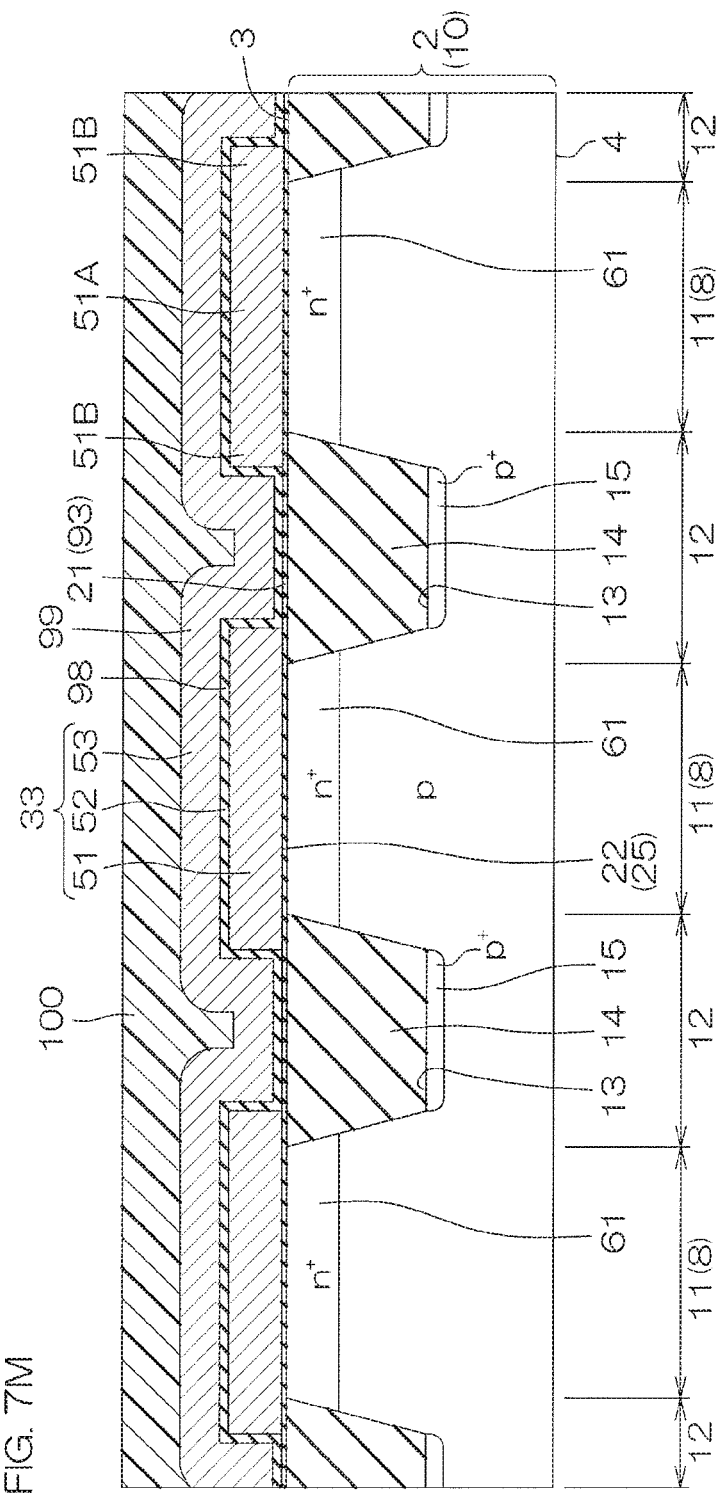

Next, referring to FIG. 6M and FIG. 7M, unnecessary portions of the second base conductor layer 99 and unnecessary portions of the base intermediate insulating layer 98 are removed by an etching method through the mask 100. Accordingly, the control gate layer 53 and the second floating gate layer 56 are formed. In addition, the first intermediate insulating layer 52 and the second intermediate insulating layer 55 are formed. Thereafter, the mask 100 is removed.

Figure 6N:
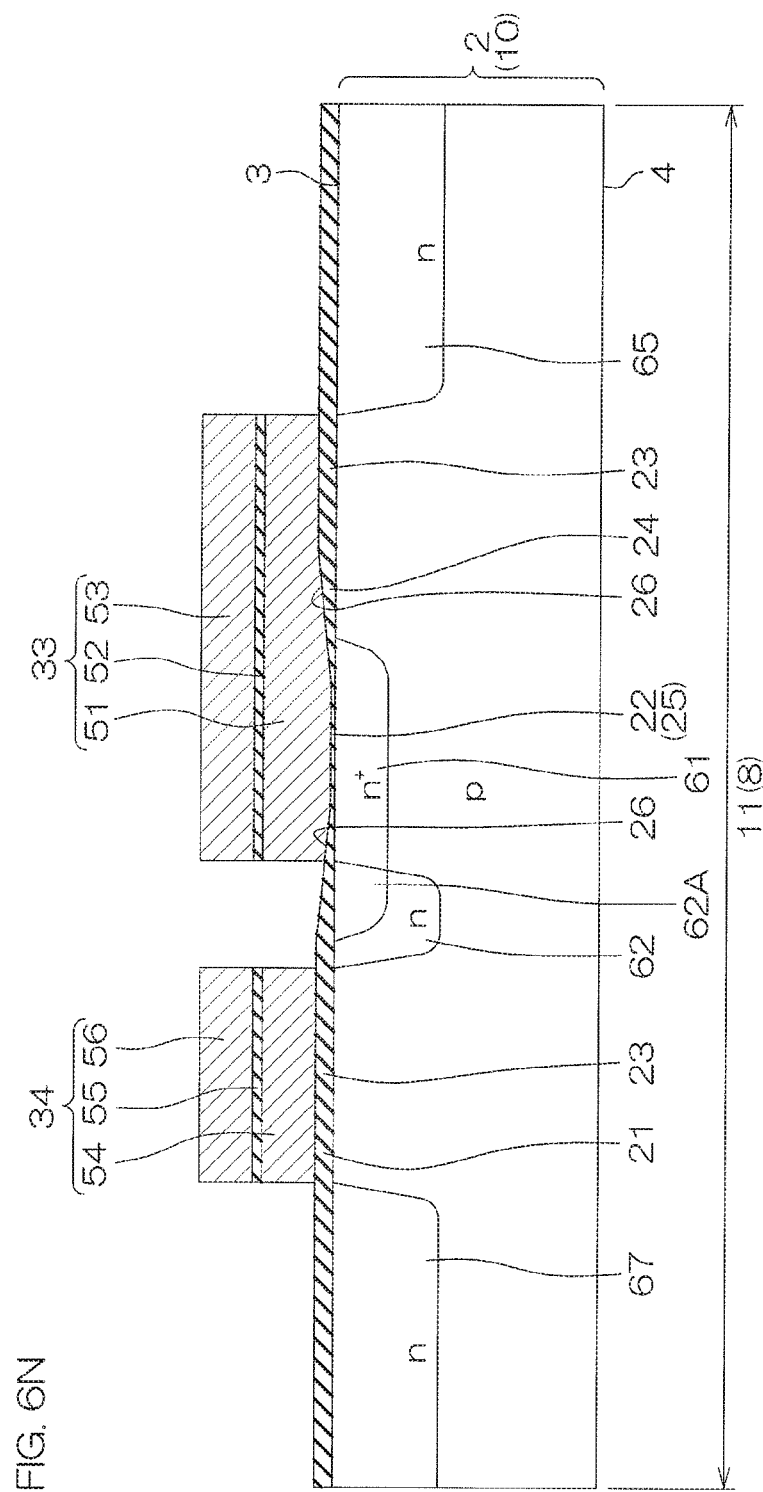
Figure 60:
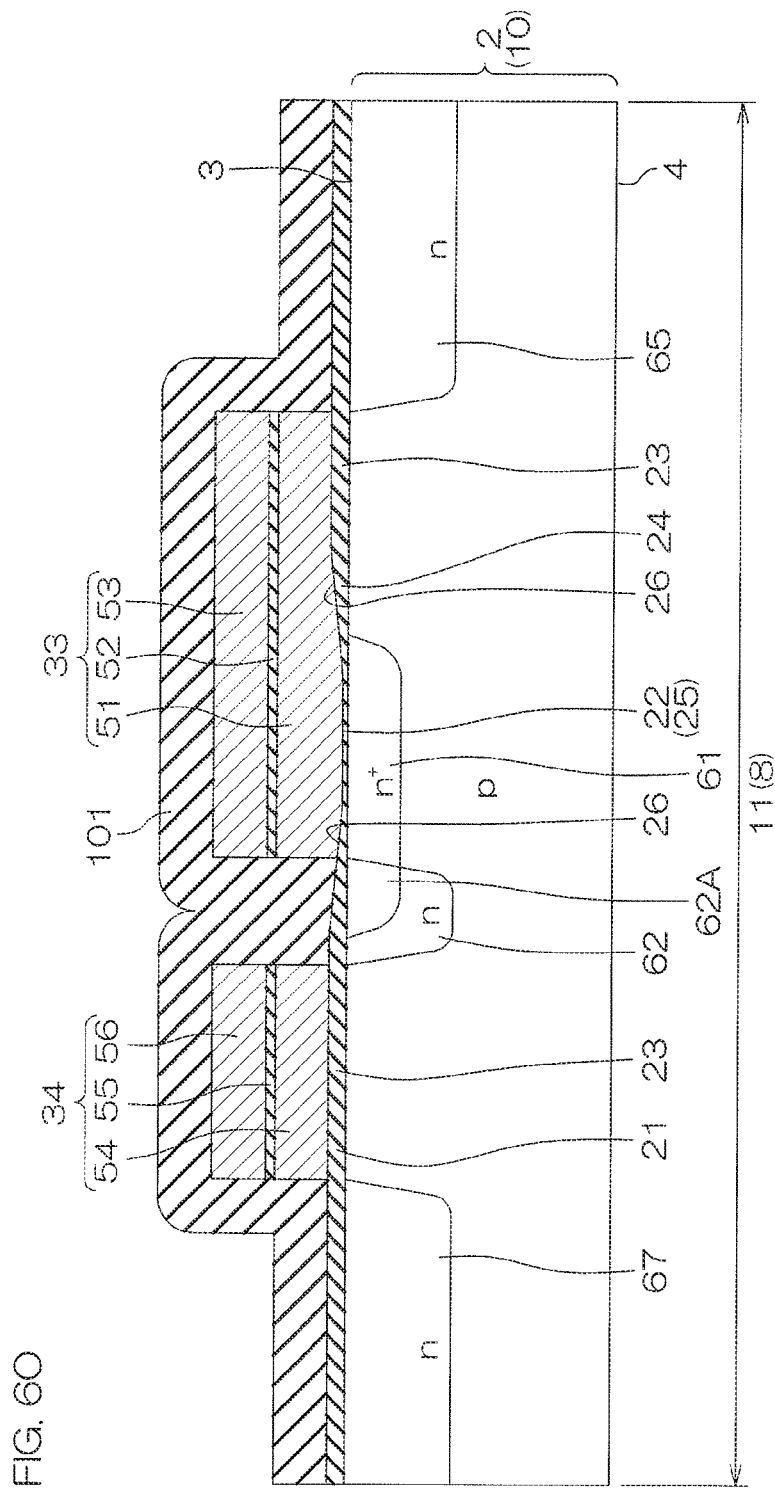
Figure 7N:
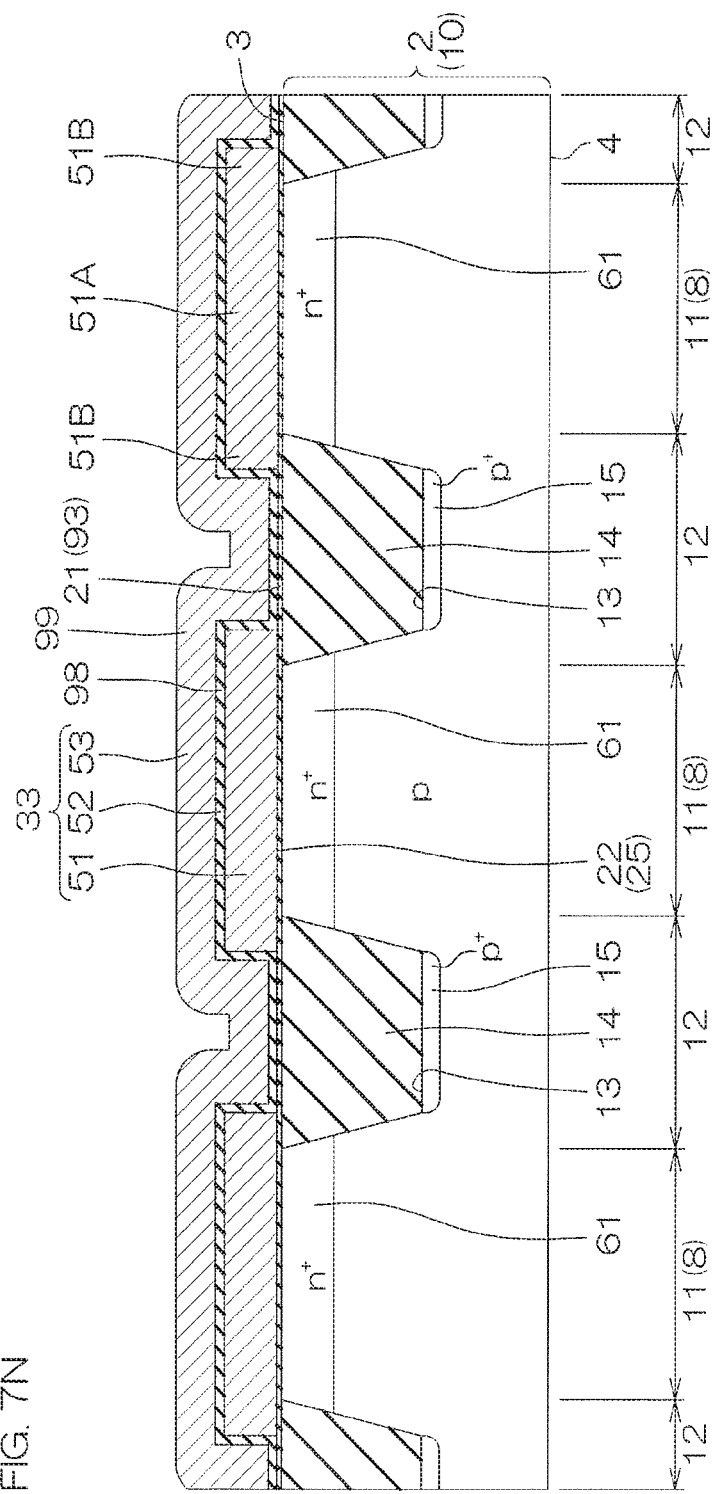
Figure 70:
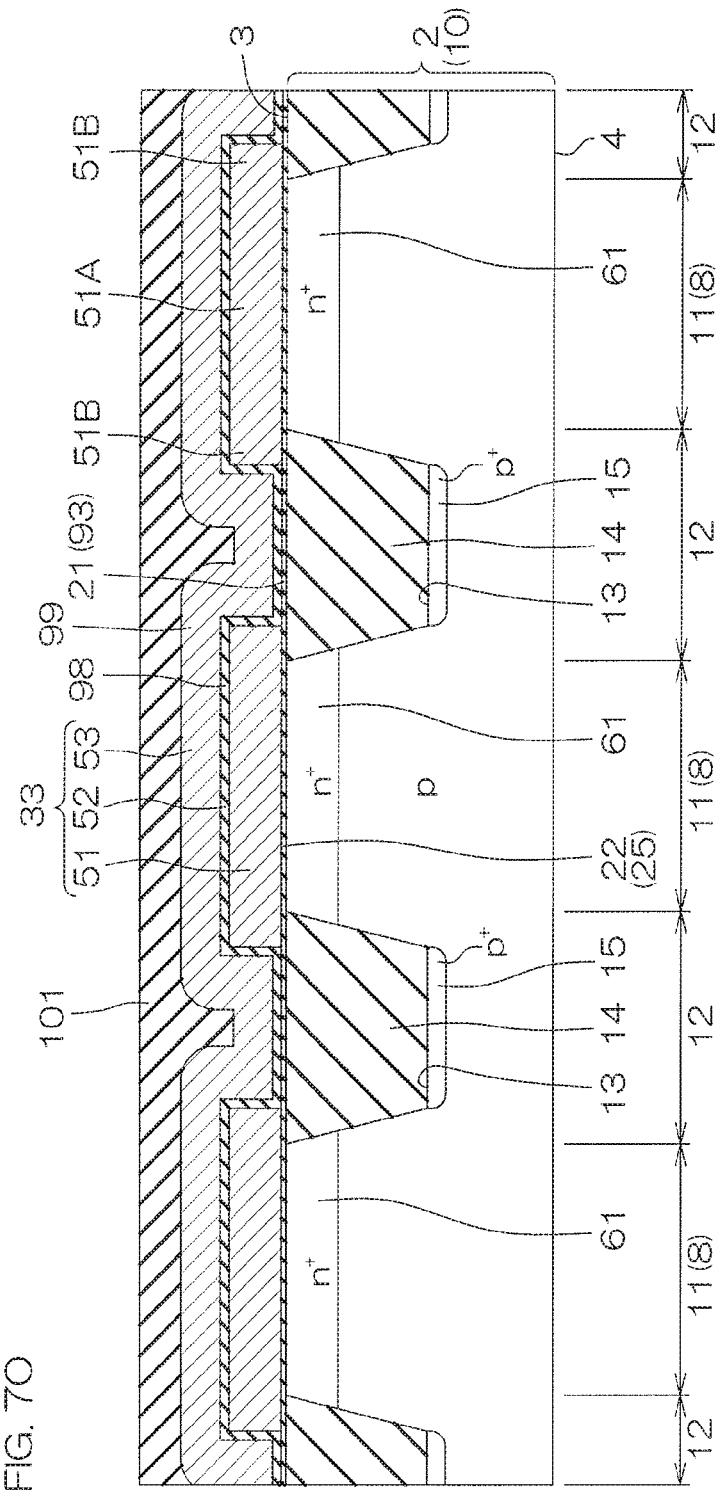

Next, referring to FIG. 6N and FIG. 7N, the tunnel low-concentration region 62, the source low-concentration region 65, and the drain low-concentration region 67 are formed. In this step, an n-type impurity is doped into the surface layer portion of the first main surface 3 by the ion implantation method through the gate insulating film 21.

Accordingly, the tunnel low-concentration region 62, the source low-concentration region 65, and the drain low-concentration region 67 are formed in a self-aligned manner with respect to the memory gate structure 33 and the select gate structure 34.

Next, referring to FIG. 6O and FIG. 7O, a second base insulating film 101 to be a base of the first side wall 39 and the second side wall 40 is formed. The second base insulating film 101 covers side surfaces of the memory gate structure 33 and the select gate structure 34 on the main surface 3. The second base insulating film 101 may be formed by the CVD method.

Figure 6P:
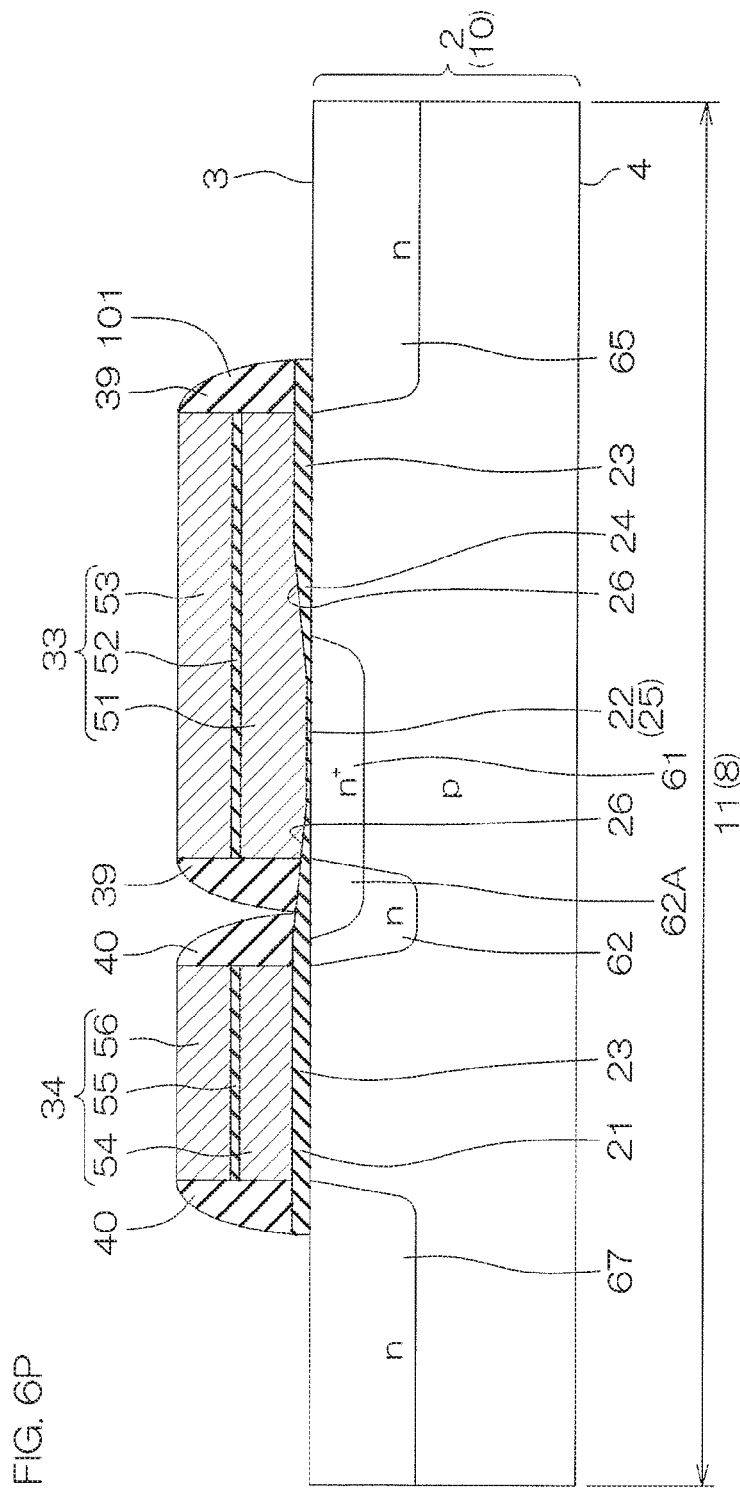
Figure 7P:
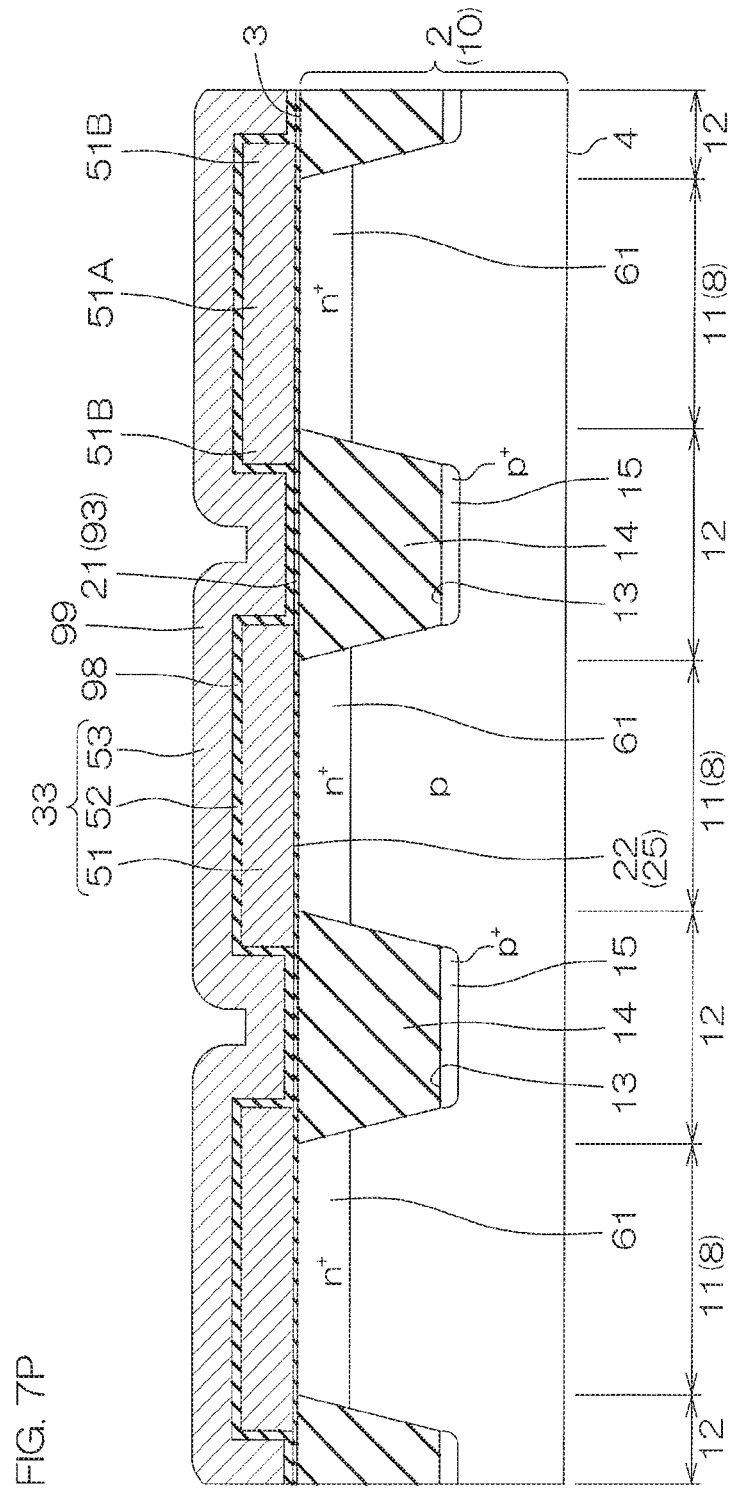

Next, referring to FIG. 6P and FIG. 7P, unnecessary portions of the second base insulating film 101 and unnecessary portions of the gate insulating film 21 are removed. The second base insulating film 101 may be removed until the memory gate structure 33 and the select gate structure 34 are exposed. The second base insulating film 101 may be removed by a dry etching method.

Accordingly, the insulating film remains on the side surfaces of the memory gate structure 33 and the side surfaces of the select gate structure 34. The first side wall 39 and the second side wall 40 are formed by the remaining portions of the insulating film.

The gate insulating film 21 may be removed until the first main surface 3 is exposed. In this step, in the thick film portion 23 of the gate insulating film 21, portions covering the source low-concentration region 65 and the drain low-concentration region 67 are selectively removed. The gate insulating film 21 may be removed by the dry etching method or wet etching method.

Figure 6Q:
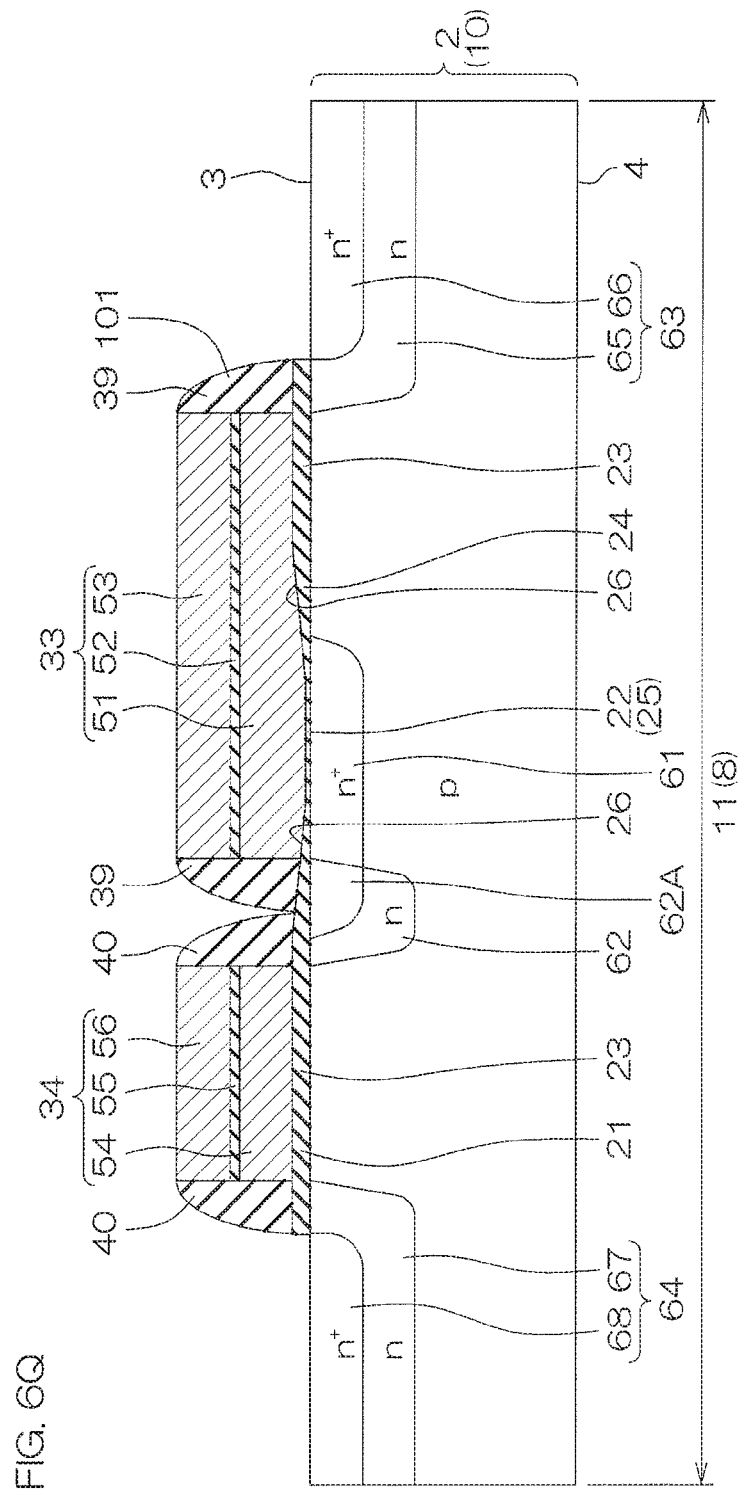
Figure 7Q:
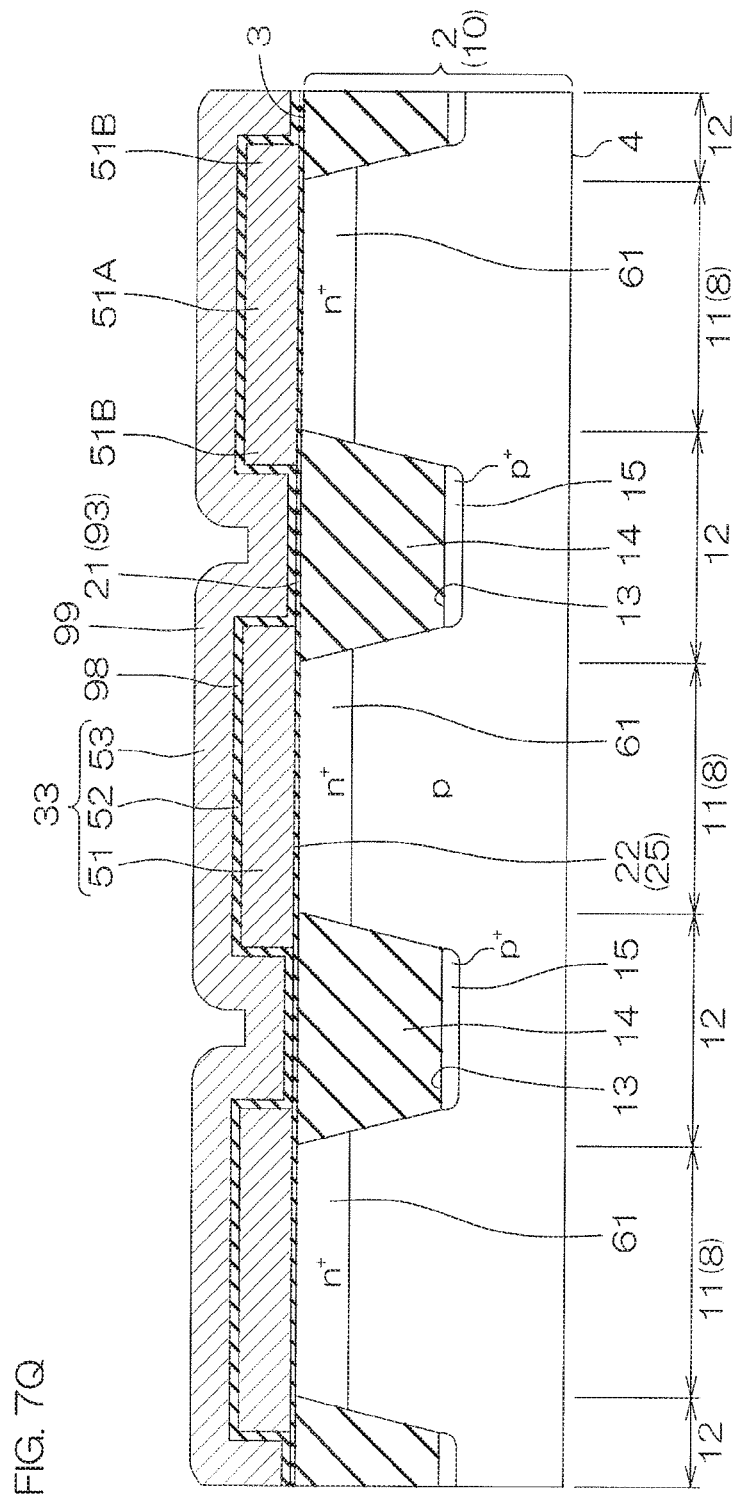

Next, referring to FIG. 6Q and FIG. 7Q, the source high-concentration region 66 and the drain high-concentration region 68 are formed. In this step, an n-type impurity is doped into the surface layer portion of the first main surface 3 by the ion implantation method.

The source high-concentration region 66 and the drain high-concentration region 68 are respectively formed in a self-aligned manner with respect to the first side wall 39 and the second side wall 40. Accordingly, the source region 63 and the drain region 64 are formed.

Figure 6R:
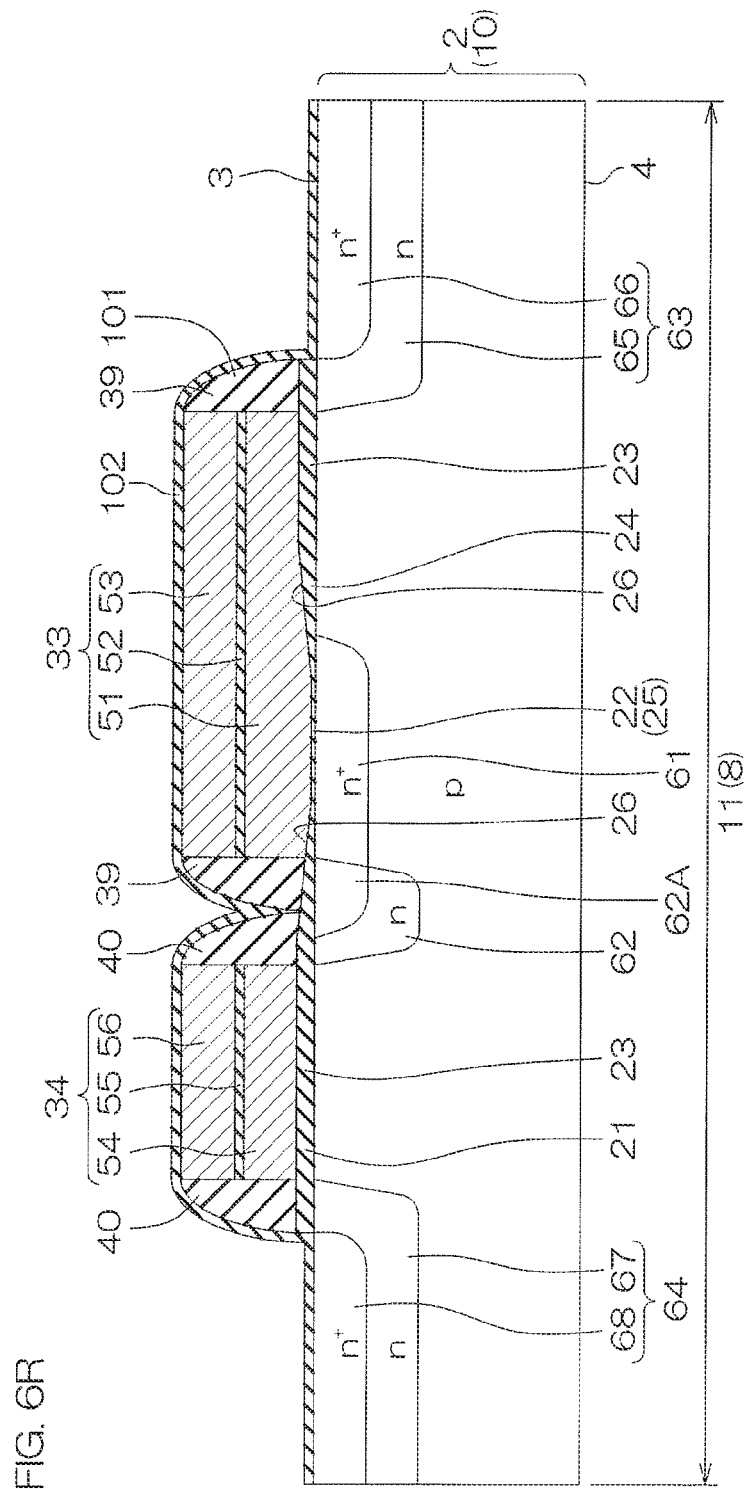
Figure 7R:
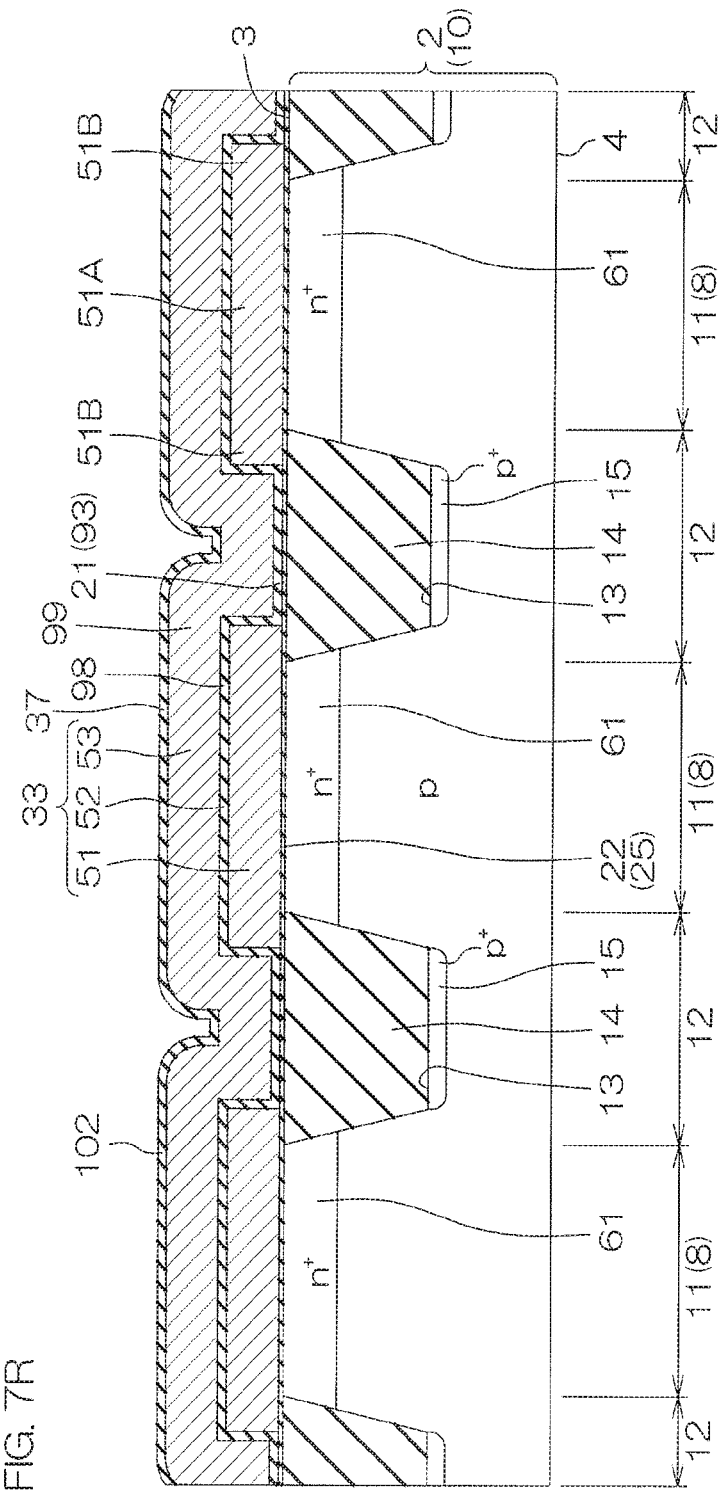

Next, referring to FIG. 6R and FIG. 7R, a third base insulating film 102 to be a base of the first outer surface insulating film 37 and the second outer surface insulating film 38 is formed so as to cover the memory gate structure 33 and the select gate structure 34. The third base insulating film 102 may be formed by the CVD method.

Figure 6S:
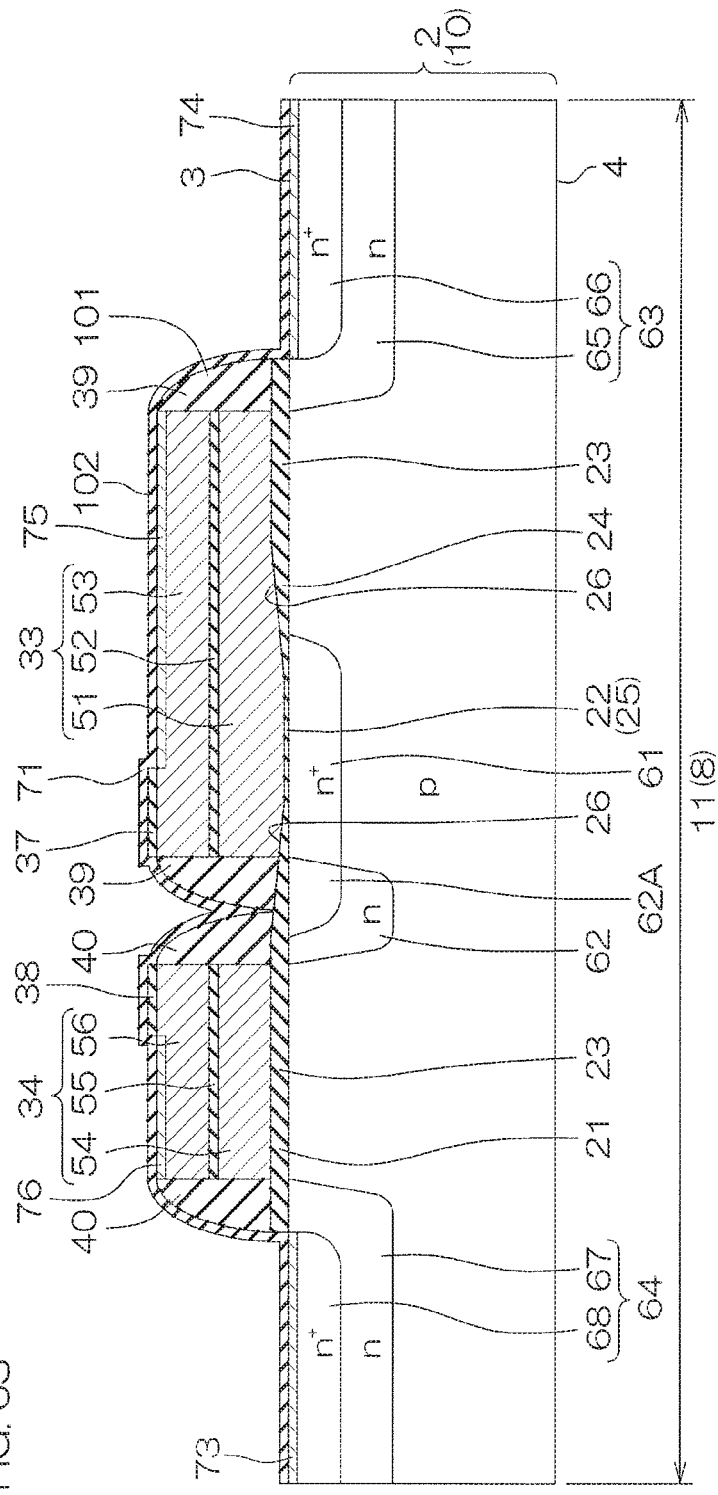
Figure 7S:
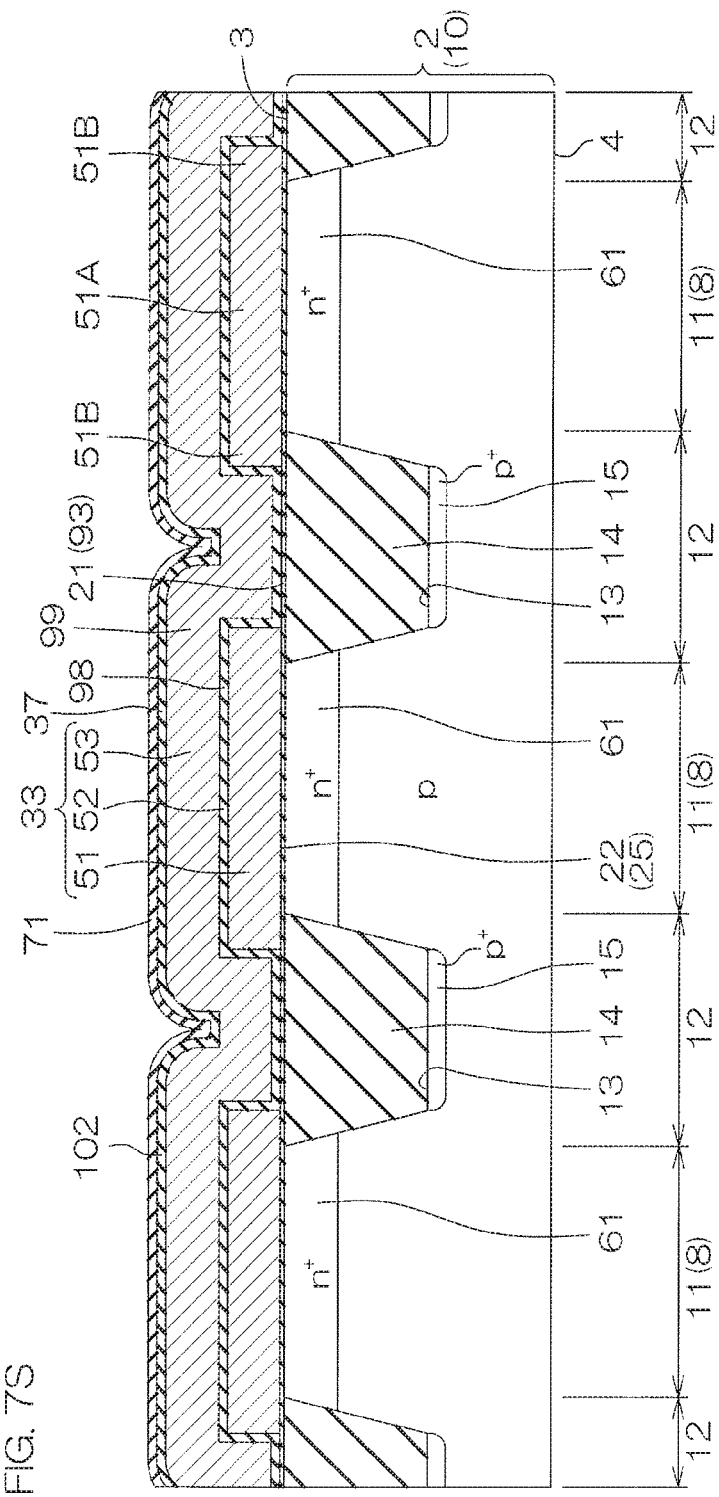
Figure 7T:
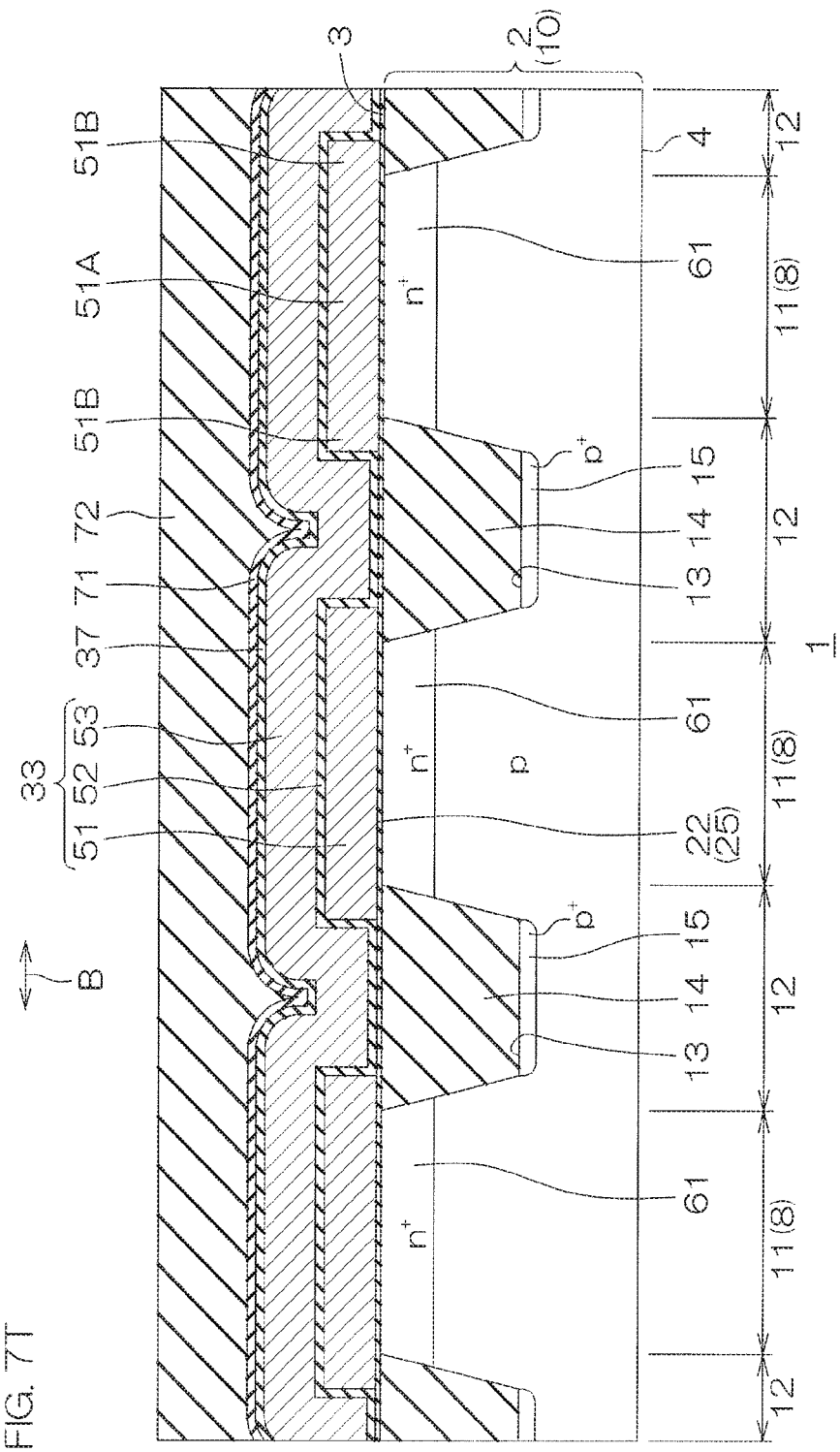

Next, referring to FIG. 6S and FIG. 7S, unnecessary portions of the third base insulating film 102 are removed. The third base insulating film 102 may be removed by an etching method through a mask (not shown). Accordingly, the first outer surface insulating film 37 covering the memory gate structure 33, and the second outer surface insulating film 38 covering the select gate structure 34, are formed.

Next, the drain silicide layer 73, the source silicide layer 74, the first gate silicide layer 75, and the second gate silicide layer 76 are respectively formed at the surface layer portion of the control gate layer 53, the surface layer portion of the second floating gate layer 56, the surface layer portion of the source region 63, and the surface layer portion of the drain region 64. Next, the protective insulating layer 71 is formed on the first main surface 3. The protective insulating layer 71 may be formed by the CVD method.

Next, referring to FIG. 6T and FIG. 7T, the interlayer insulating layer 72 is formed on the protective insulating layer 71. The interlayer insulating layer 72 may be formed by the CVD method. Thereafter, the drain connection electrode 31, the source connection electrode 32, the first gate connection electrode, and the second gate connection electrode respectively including the contact electrode layer 77 and the wiring electrode layer 78 are formed. Through the steps described above, the semiconductor device 1 is manufactured.

FIG. 8 is an enlarged view of a portion corresponding to FIG. 5, and is an enlarged view to describe a structure of a semiconductor device 111 according to a second preferred embodiment of the present invention. Hereinafter, a structure corresponding to a structure described in relation to the semiconductor device 1 is provided with the same reference sign, and description of such a structure is omitted.

In the semiconductor device 1, a portion positioned on the select gate structure 34 side of the second connection end portions 28 is positioned in the region between the memory gate structure 33 and the select gate structure 34. On the other hand, in the semiconductor device 111, a portion positioned on the select gate structure 34 side of the second connection end portions 28 is in contact with a side surface of the memory gate structure 33 in the region between the memory gate structure 33 and the select gate structure 34.

The semiconductor device 111 described above also brings about a similar effect as that described in the semiconductor device 1.

Figure 9:
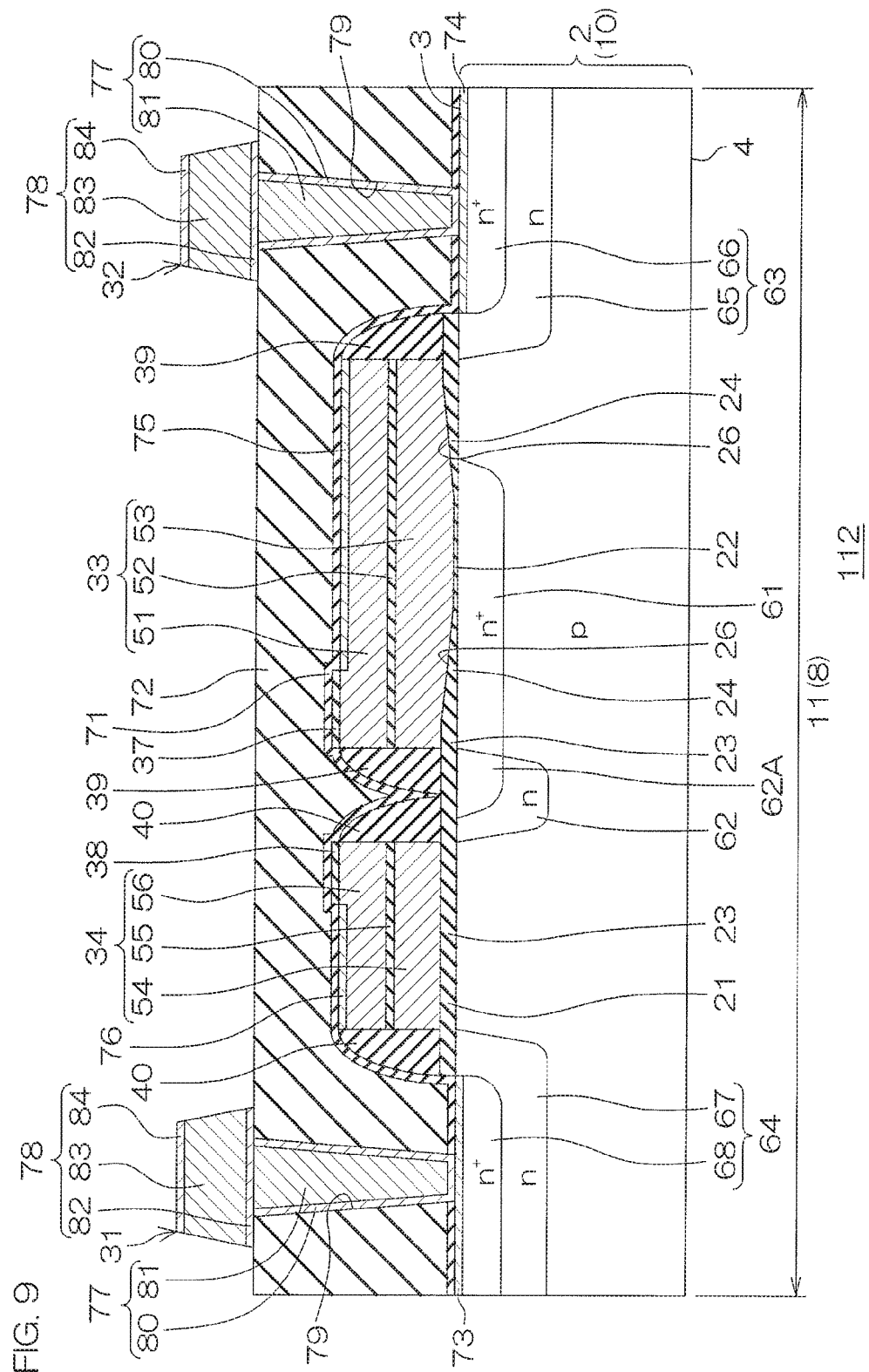
FIG. 9 is a sectional view of a portion corresponding to FIG. 3, and is a sectional view to describe a structure of a semiconductor device according to a third preferred embodiment of the present invention.

FIG. 9 is a sectional view of a portion corresponding to FIG. 3, and is a sectional view to describe a structure of a semiconductor device 112 according to a third preferred embodiment of the present invention. Hereinafter, a structure corresponding to a structure described in relation to the semiconductor device 1 is provided with the same reference sign, and description of such a structure is omitted.

In the semiconductor device 1, a portion positioned on the select gate structure 34 side of the second connection end portions 28 is positioned in the region between the memory gate structure 33 and the select gate structure 34. On the other hand, in the semiconductor device 112, the entire region of the thin film portion 22 and the entire region of the inclined portion 24 in the gate insulating film 21 are covered by the memory gate structure 33.

The semiconductor device 112 described above also brings about a similar effect as that described in the semiconductor device 1.

Preferred embodiments of the present invention are described above, however, the present invention can also be carried out in other preferred embodiments.

In the respective preferred embodiments described above, structures in which conductivity types of the respective semiconductor portions are inverted may be adopted. That is, a p-type portion may be converted into an n-type, and an n-type portion may be converted into a p-type.

The first preferred embodiment described above describes an example in which the select gate structure 34 has a laminated structure including the select gate layer 54, the second intermediate insulating layer 55, and the second floating gate layer 56. However, a select gate structure 34 shown in FIG. 10 may be adopted.

FIG. 10 is a sectional view of a portion corresponding to FIG. 3, and is a sectional view showing a modification of the select gate structure 34. Hereinafter, a structure corresponding to a structure described in relation to the semiconductor device 1 is provided with the same reference sign, and description of such a structure is omitted.

Referring to FIG. 10, the select gate structure 34 has a single-layer structure that does not include the second intermediate insulating layer 55 and the second floating gate layer 56, but includes the select gate layer 54. In this structure, a second gate connection electrode (not shown) for the select gate structure 34 is connected to the select gate layer 54 by penetrating through the interlayer insulating layer 72. The second gate connection electrode (not shown) is connected to the select gate layer 54 via the second gate silicide layer 76.

The structure of the select gate structure 34 according to FIG. 10 is also applicable to the second preferred embodiment and the third preferred embodiment described above.

In the first preferred embodiment described above, an example in which the semiconductor layer 2 includes the p-type semiconductor substrate 10 is described. However, a semiconductor layer 2 shown in FIG. 11 may be adopted.

FIG. 11 is a sectional view of a portion corresponding to FIG. 3, and is a sectional view showing a modification of the semiconductor layer 2. Hereinafter, a structure corresponding to a structure described in relation to the semiconductor device 1 is provided with the same reference sign, and description of such a structure is omitted.

Referring to FIG. 11, the semiconductor layer 2 may have a laminated structure including the p-type semiconductor substrate 10 and a p-type epitaxial layer 113 formed on the p-type semiconductor substrate 10. The p-type epitaxial layer 113 has a p-type impurity concentration lower than that of the p-type semiconductor substrate 10.

The second main surface 4 of the semiconductor layer 2 is formed by the p-type semiconductor substrate 10. The first main surface 3 is formed by the p-type epitaxial layer 11. The EEPROM 8, etc., are incorporated in the p-type epitaxial layer 113.

The structure of the semiconductor layer 2 according to FIG. 11 is also applicable to the second preferred embodiment and the third preferred embodiment described above.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A semiconductor device comprising:
   a semiconductor layer having a main surface;
   a gate insulating film including a thin film portion forming a tunnel window, a thick film portion formed around the thin film portion and having a thickness larger than a thickness of the thin film portion, and an inclined portion connecting the thin film portion and the thick film portion and inclined upward from the thin film portion toward the thick film portion, and covering the main surface of the semiconductor layer;
   a memory gate structure formed on the thin film portion of the gate insulating film; and
   a select gate structure formed on the thick film portion of the gate insulating film;
   wherein an angle θ of the inclined portion in the gate insulating film is more than 0° and less than 45°.

2. The semiconductor device according to claim 1, wherein the memory gate structure is formed on the thin film portion and the inclined portion of the gate insulating film.

3. The semiconductor device according to claim 1, wherein a connection portion connecting the thick film portion and the inclined portion in the gate insulating film is formed in a region between the memory gate structure and the select gate structure.

4. The semiconductor device according to claim 1, wherein the memory gate structure is formed on the thin film portion and the inclined portion of the gate insulating film so as to expose a portion of the inclined portion.

5. The semiconductor device according to claim 1, further comprising: a side wall covering a side surface of the memory gate structure.

6. The semiconductor device according to claim 5, wherein the side wall is in contact with the inclined portion of the gate insulating film.

7. The semiconductor device according to claim 1, wherein the memory gate structure covers an entire region of the thin film portion and an entire region of the inclined portion of the gate insulating film.

8. The semiconductor device according to claim 1, further comprising: a first conductivity type tunnel region formed in a region facing the memory gate structure across the thin film portion of the gate insulating film at a surface layer portion of the main surface of the semiconductor layer.

9. The semiconductor device according to claim 8, further comprising:
   a source region of a first conductivity type formed at the surface layer portion of the main surface of the semiconductor layer and serving as a source of the memory gate structure; and
   a drain region of a first conductivity type formed at the surface layer portion of the main surface of the semiconductor layer and serving as a drain of the select gate structure, wherein
   the tunnel region functions as a drain region of the memory gate structure, and functions as a source region of the select gate structure.

10. The semiconductor device according to claim 1, wherein the memory gate structure includes a control gate layer.

11. The semiconductor device according to claim 1, wherein the select gate structure includes a select gate layer.

* * * * *